(12) United States Patent
Noguchi et al.

(10) Patent No.: US 10,747,348 B2
(45) Date of Patent: Aug. 18, 2020

(54) SENSOR DEVICE AND SENSOR-EQUIPPED DISPLAY DEVICE

(71) Applicant: Japan Display Inc., Tokyo (JP)

(72) Inventors: Koji Noguchi, Tokyo (JP); Yasushi Nakano, Tokyo (JP); Masaki Murase, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/206,657

(22) Filed: Nov. 30, 2018

(65) Prior Publication Data

US 2019/0114014 A1    Apr. 18, 2019

Related U.S. Application Data

(63) Continuation of application No. 15/410,633, filed on Jan. 19, 2017, now Pat. No. 10,175,798.

(30) Foreign Application Priority Data

Jan. 19, 2016  (JP) ................................. 2016-008137

(51) Int. Cl.
*G06F 3/041* (2006.01)
*H05K 1/18* (2006.01)
(Continued)

(52) U.S. Cl.
CPC ........ *G06F 3/0412* (2013.01); *G02F 1/13338* (2013.01); *G06F 3/044* (2013.01);
(Continued)

(58) Field of Classification Search
CPC ........ G06F 1/183; G06F 3/044; G06F 3/0412; G02F 1/13452; G02F 1/1345;
(Continued)

(56) References Cited

U.S. PATENT DOCUMENTS 9,323,289 B2 * 4/2016 Oohira .................. G06F 1/1643
10,459,551 B2 * 10/2019 Kurasawa ........... G02F 1/13338
(Continued)

FOREIGN PATENT DOCUMENTS

JP    2011-065515 A    3/2011
JP    2013-152561 A    8/2013
(Continued)

OTHER PUBLICATIONS

Japanese Office Action dated May 7, 2019, corresponding to Japanese Patent Application 2016-008137.

*Primary Examiner* — Sanjiv D. Patel
(74) *Attorney, Agent, or Firm* — Michael Best & Friedrich LLP

(57) ABSTRACT

According to one embodiment, a sensor-equipped display device includes a first substrate includes a first electrode located in a display area in which an image is displayed, a second substrate includes a second electrode which is located in the display area, and outputs a sensor signal, and a flexible substrate includes a first connection portion connected to the first substrate and a second connection portion connected to the second substrate, the flexible substrate includes a common base layer extending between the first connection portion and the second connection portion.

17 Claims, 25 Drawing Sheets

(51) Int. Cl.
  *H05K 1/14*   (2006.01)
  *G02F 1/1333* (2006.01)
  *G09G 3/20*   (2006.01)
  *G06F 3/044*  (2006.01)
  *H05K 3/36*   (2006.01)

(52) U.S. Cl.
  CPC ............. *G06F 3/0416* (2013.01); *G09G 3/20* (2013.01); *H05K 1/147* (2013.01); *H05K 1/189* (2013.01); *G06F 2203/04102* (2013.01); *G06F 2203/04111* (2013.01); *H05K 3/361* (2013.01)

(58) Field of Classification Search
  CPC ... G02F 1/1343; G02F 1/13458; H05K 3/361; H05K 1/147; H05K 2201/10128
  See application file for complete search history.

(56) References Cited

U.S. PATENT DOCUMENTS

| | | |
|---|---|---|
| 2008/0165158 A1 | 7/2008 | Hotelling et al. |
| 2009/0194342 A1 | 8/2009 | Kuo et al. |
| 2009/0322704 A1 | 12/2009 | Anno |
| 2010/0108409 A1 | 5/2010 | Tanaka et al. |
| 2010/0295824 A1 | 11/2010 | Noguchi et al. |
| 2011/0069036 A1 | 3/2011 | Anno |
| 2011/0134075 A1* | 6/2011 | Takusa .................... G06F 3/044 345/174 |
| 2012/0262387 A1 | 10/2012 | Mizuhashi et al. |
| 2012/0319967 A1 | 12/2012 | Tsai et al. |
| 2013/0278516 A1 | 10/2013 | Nagata et al. |
| 2014/0028939 A1* | 1/2014 | Nakano ............... G02F 1/13338 349/42 |
| 2014/0098055 A1* | 4/2014 | Choi ..................... G06F 3/0416 345/174 |
| 2014/0152617 A1 | 6/2014 | Kida et al. |
| 2014/0313439 A1* | 10/2014 | Matsumoto ........... G06F 3/0412 349/12 |
| 2015/0002759 A1* | 1/2015 | Nakano ................. G06F 3/0412 349/12 |
| 2015/0062456 A1* | 3/2015 | Miyazaki ................ G06F 3/044 349/12 |
| 2015/0077656 A1 | 3/2015 | Ito et al. |
| 2015/0162388 A1 | 6/2015 | Kim |
| 2015/0303219 A1* | 10/2015 | Tada .................... G02F 1/13452 349/43 |
| 2015/0309636 A1 | 10/2015 | Kurasawa et al. |
| 2017/0012378 A1* | 1/2017 | Hassan-Ali ............ H01R 12/79 |

FOREIGN PATENT DOCUMENTS

| | | |
|---|---|---|
| JP | 2014-192337 A | 10/2014 |
| JP | 2015-7945 A | 1/2015 |
| JP | 2015-72663 A | 4/2015 |
| JP | 2015-191981 A | 11/2015 |

\* cited by examiner

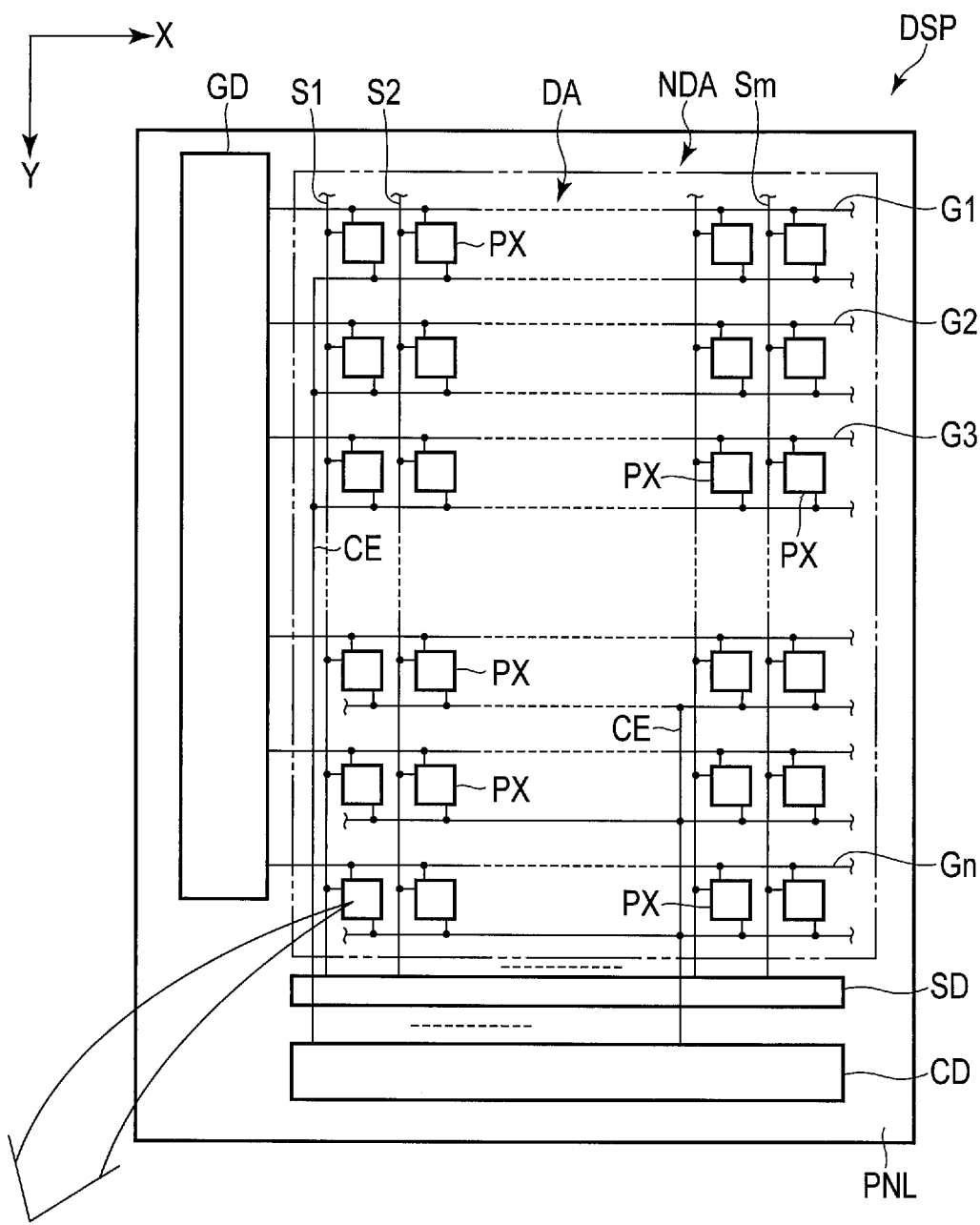
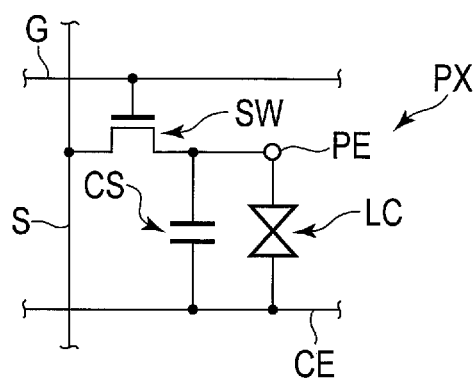
F I G. 2

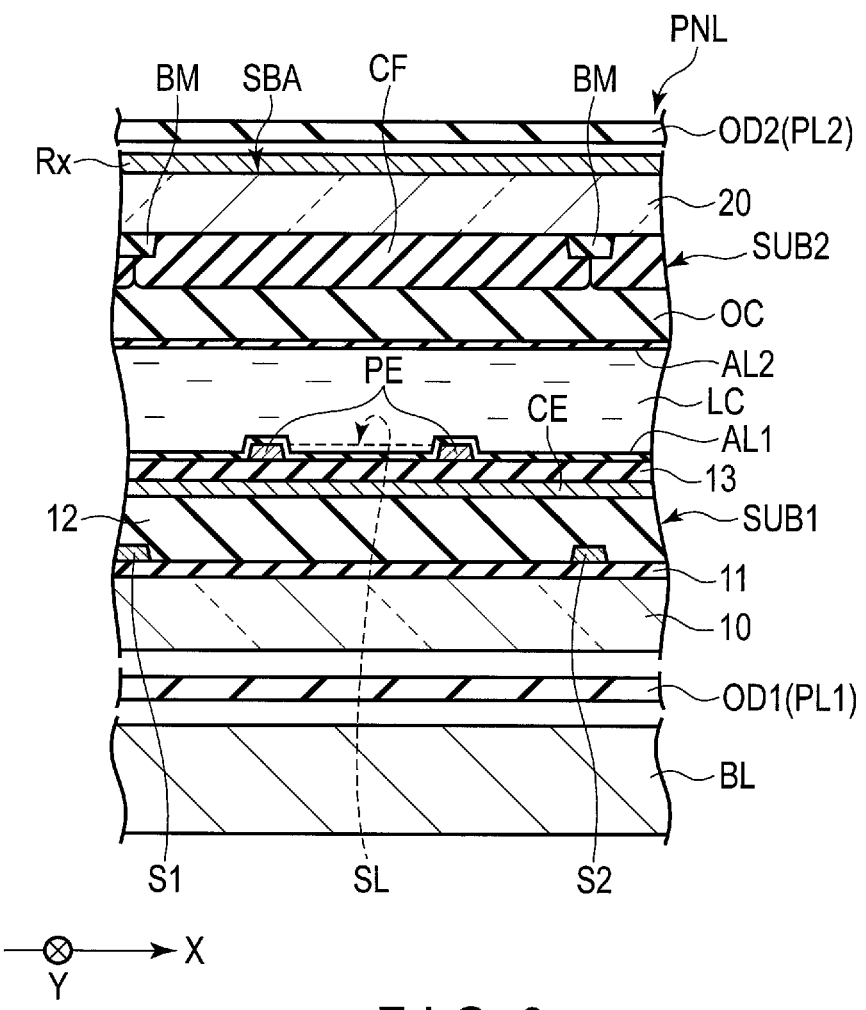
F I G. 3

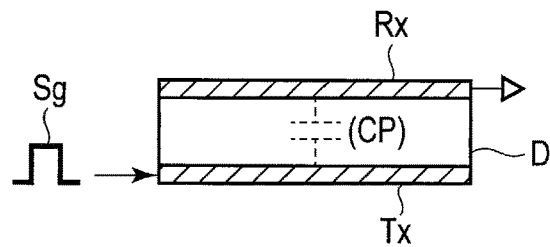
F I G. 4A
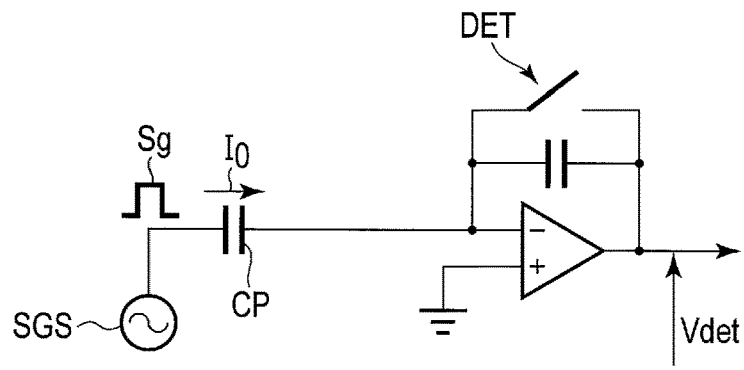
F I G. 4B
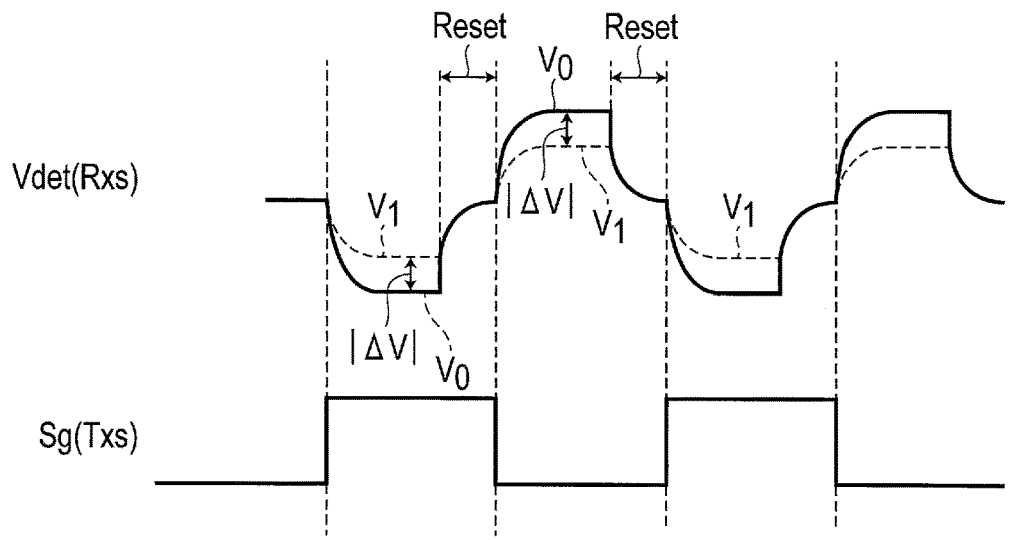
F I G. 4C

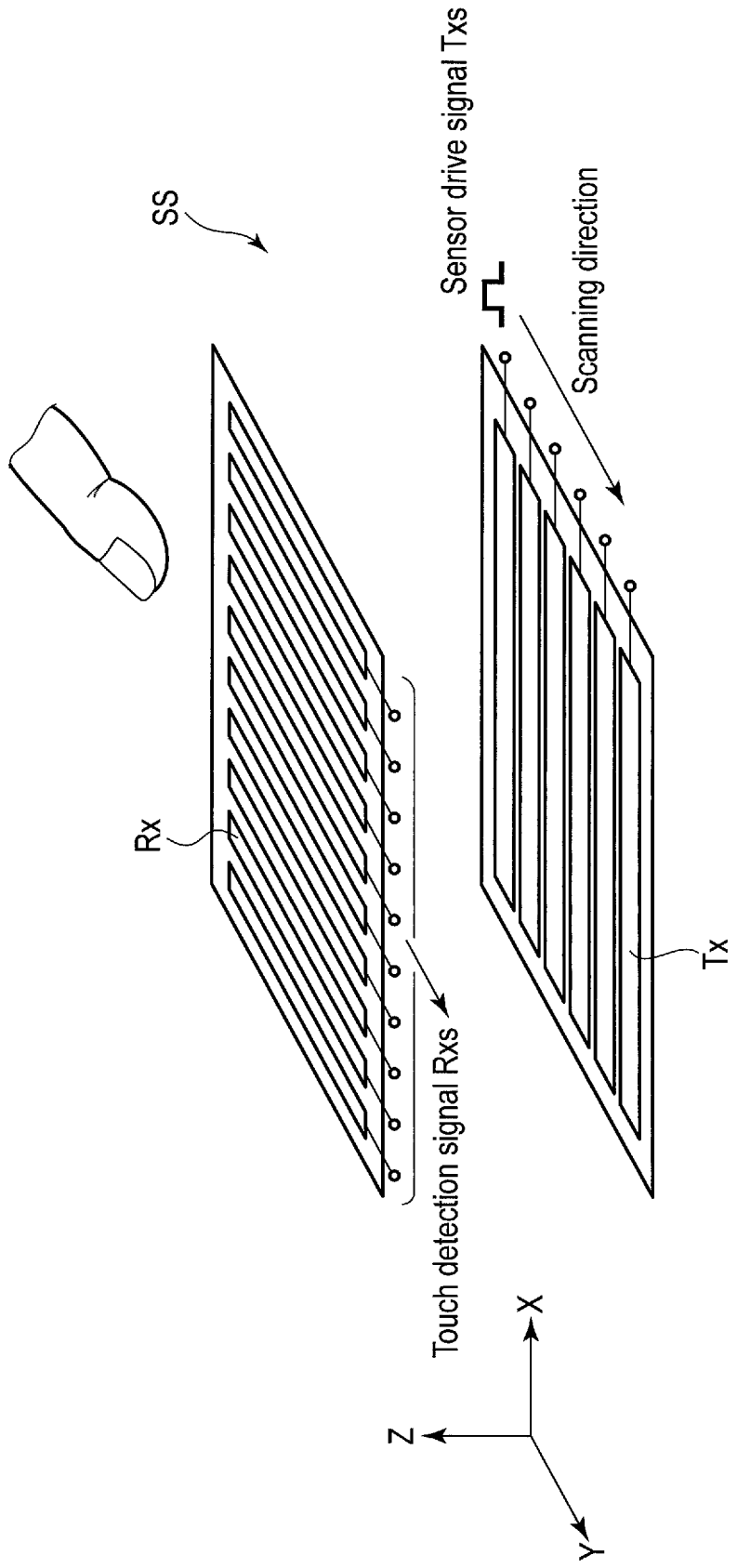
F I G. 4E

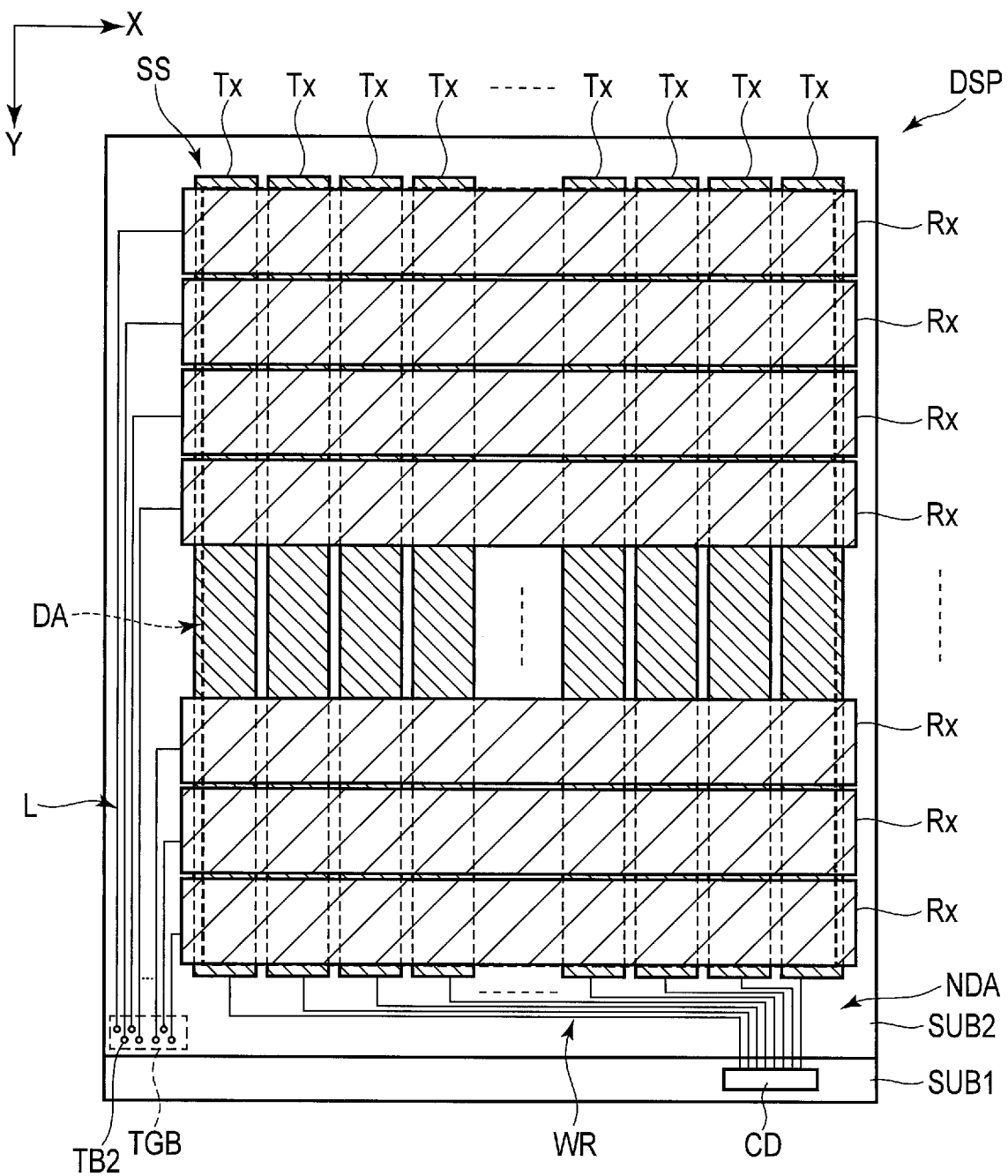
F I G. 4F

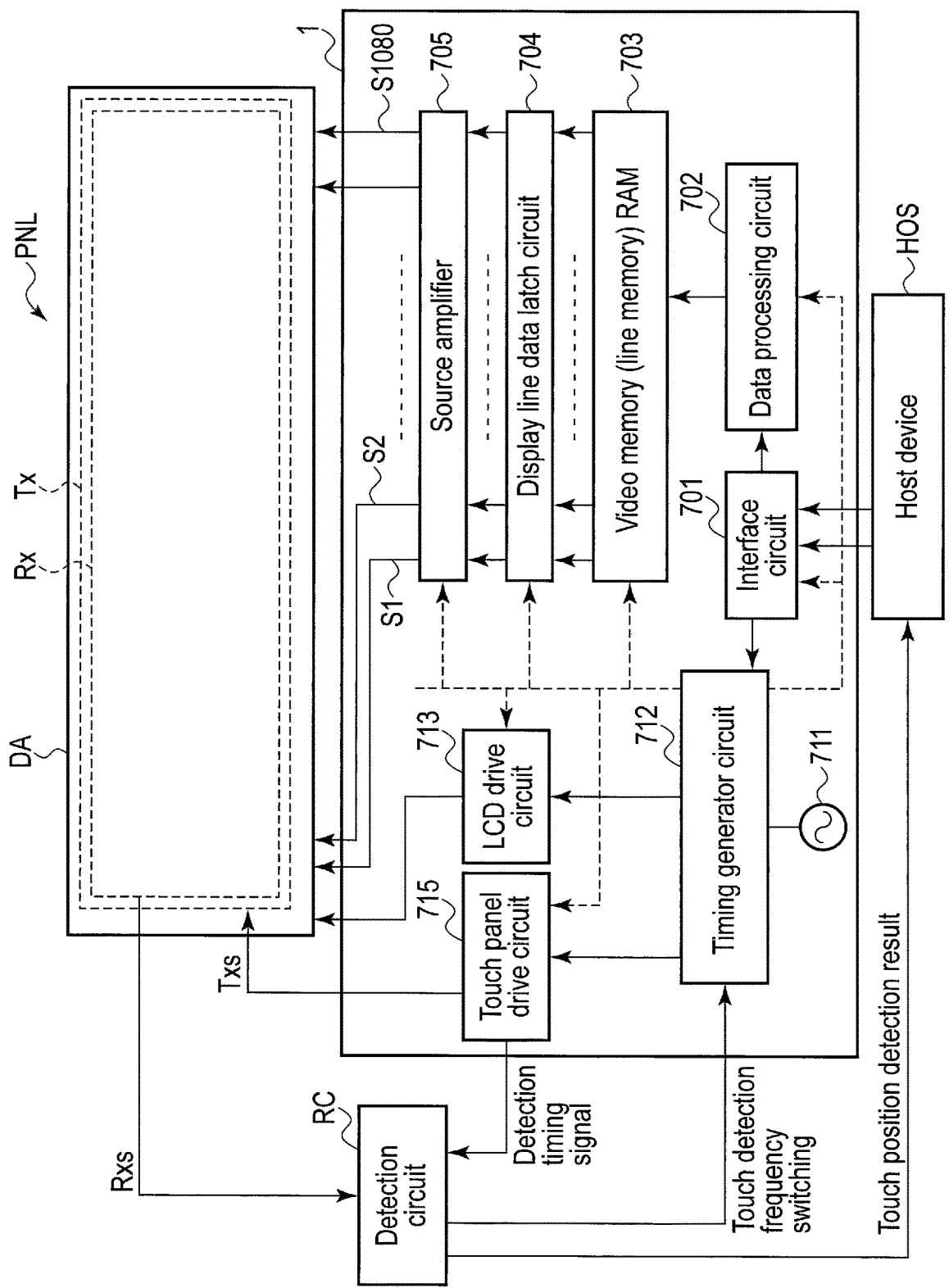
F I G. 5B

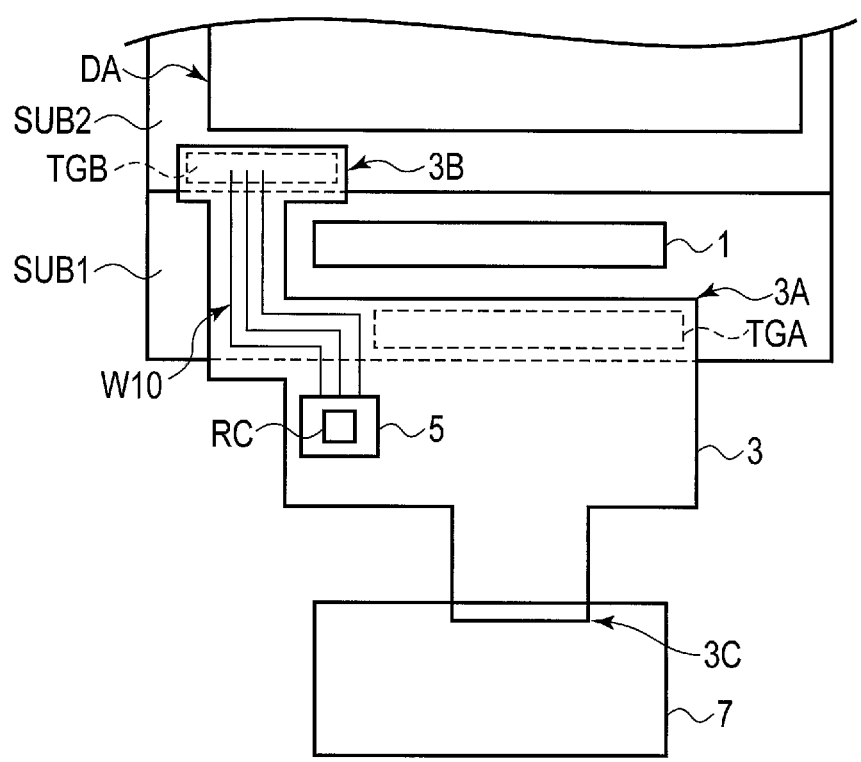
F I G. 6A

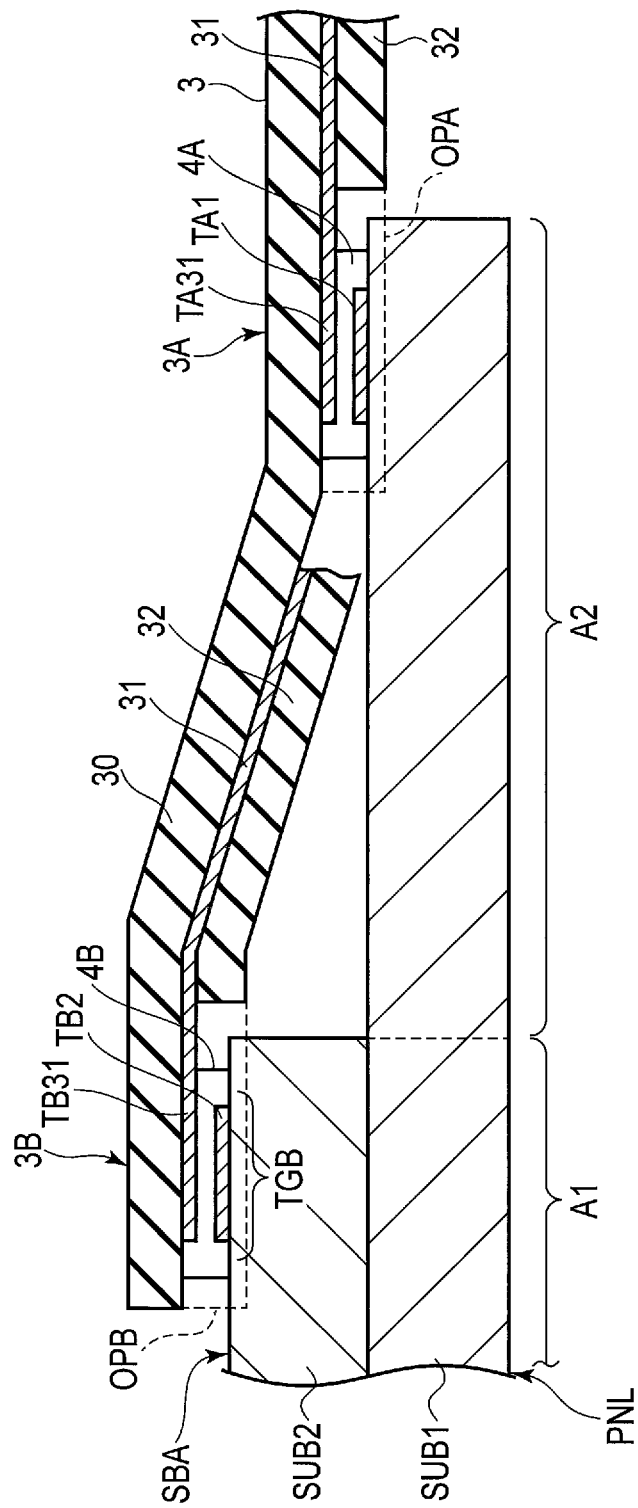
F I G. 6B

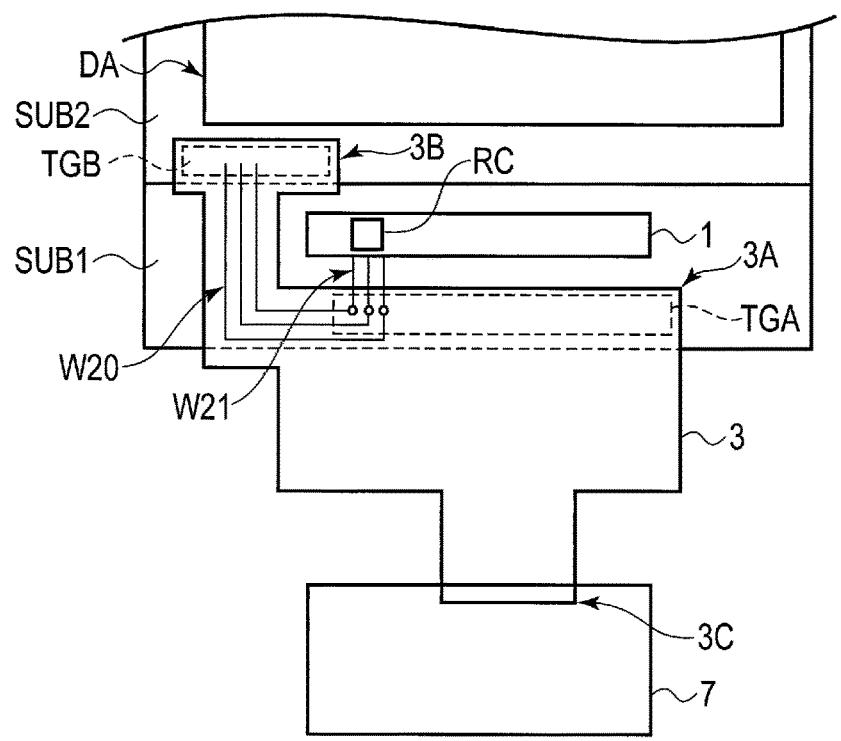
F I G. 7
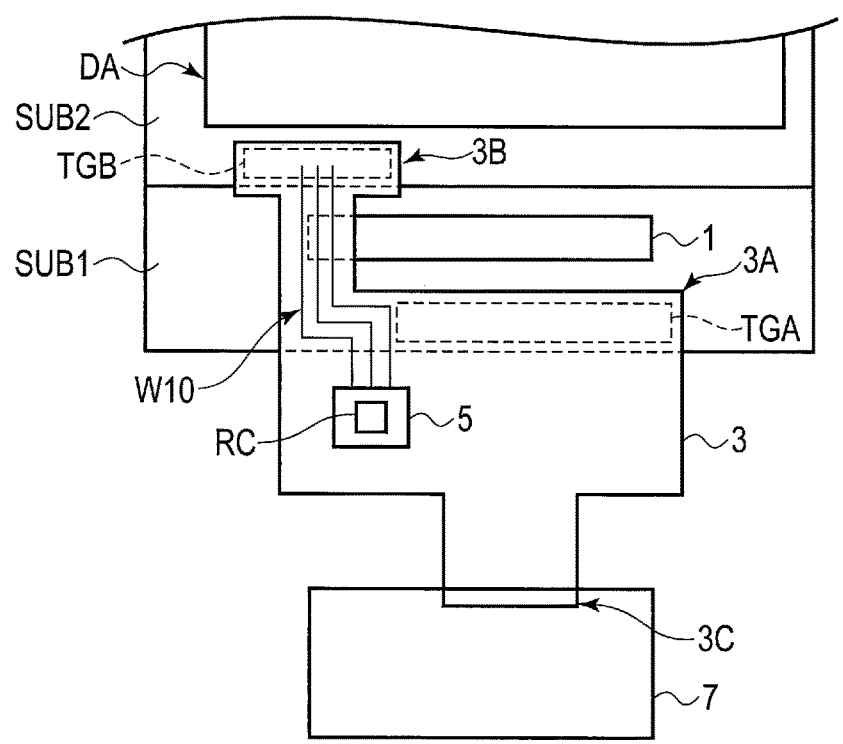
F I G. 8

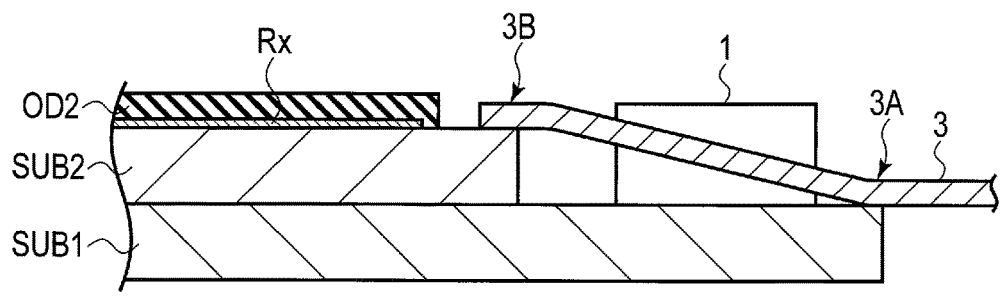
F I G. 9
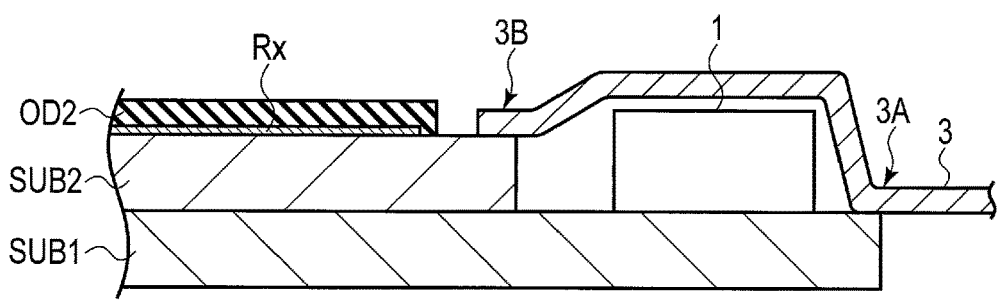
F I G. 10
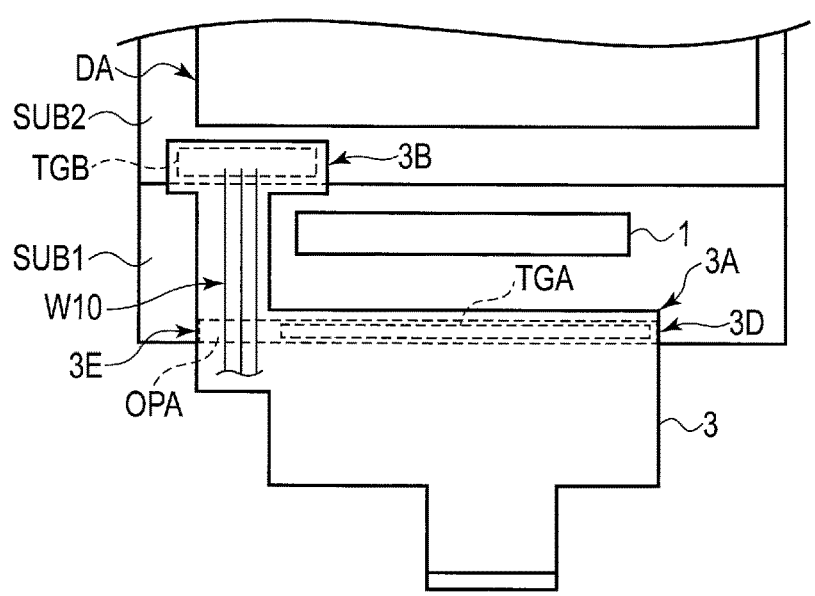
F I G. 11

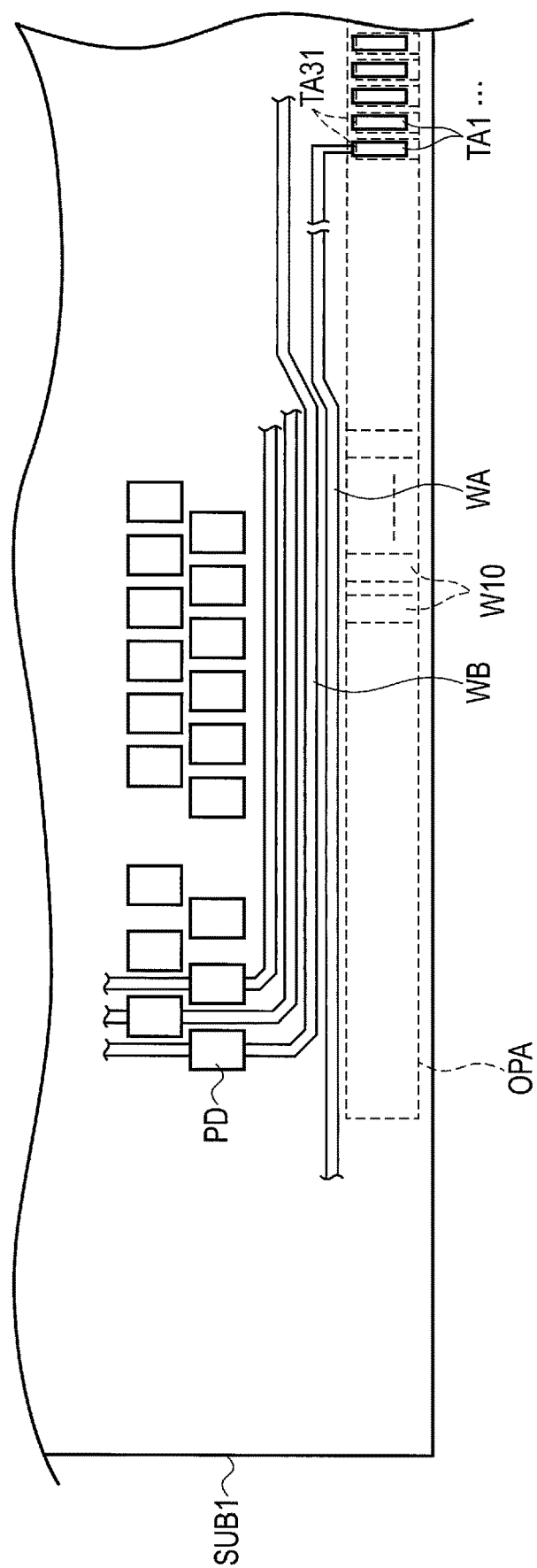
F I G. 14

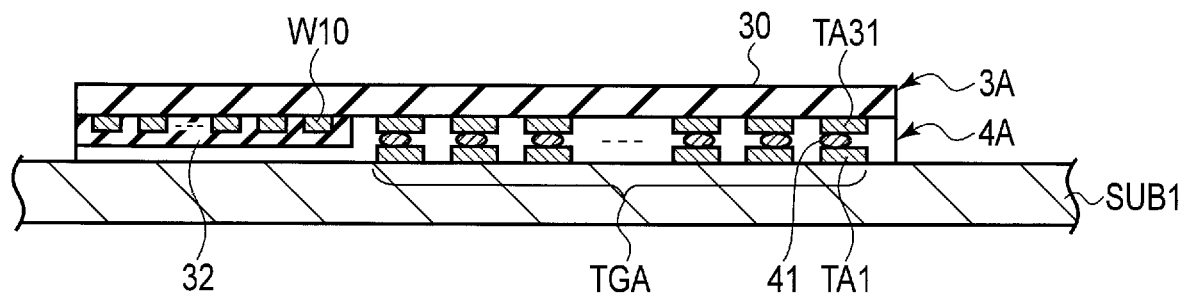
F I G. 18
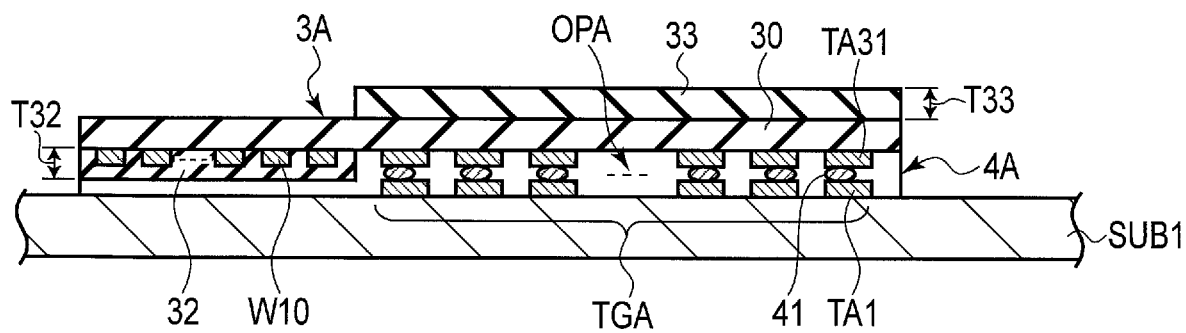
F I G. 19
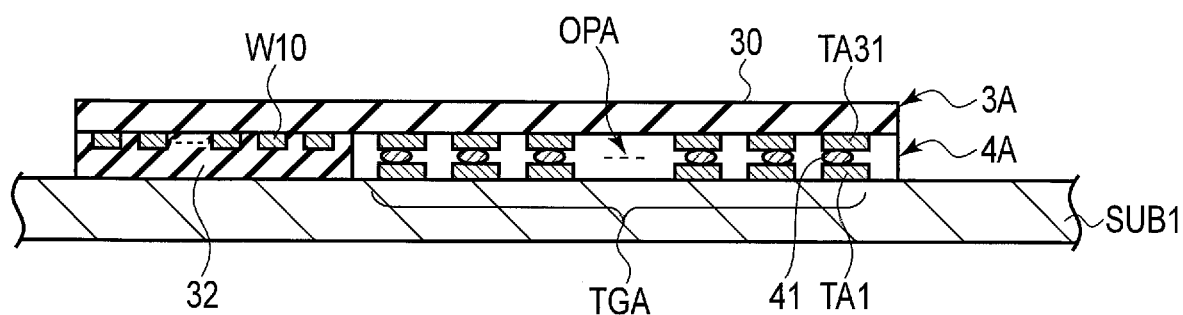
F I G. 20

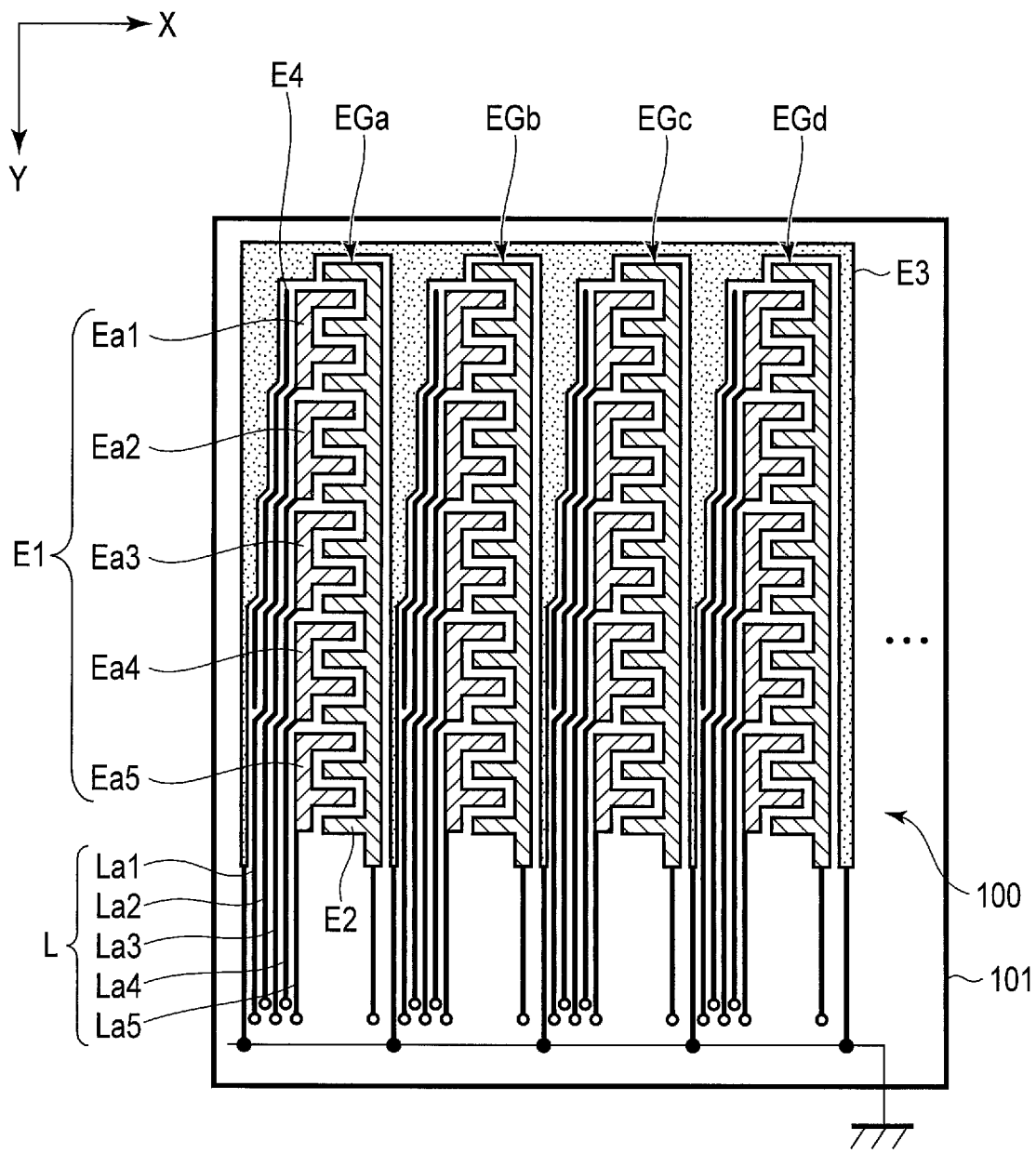
F I G. 22

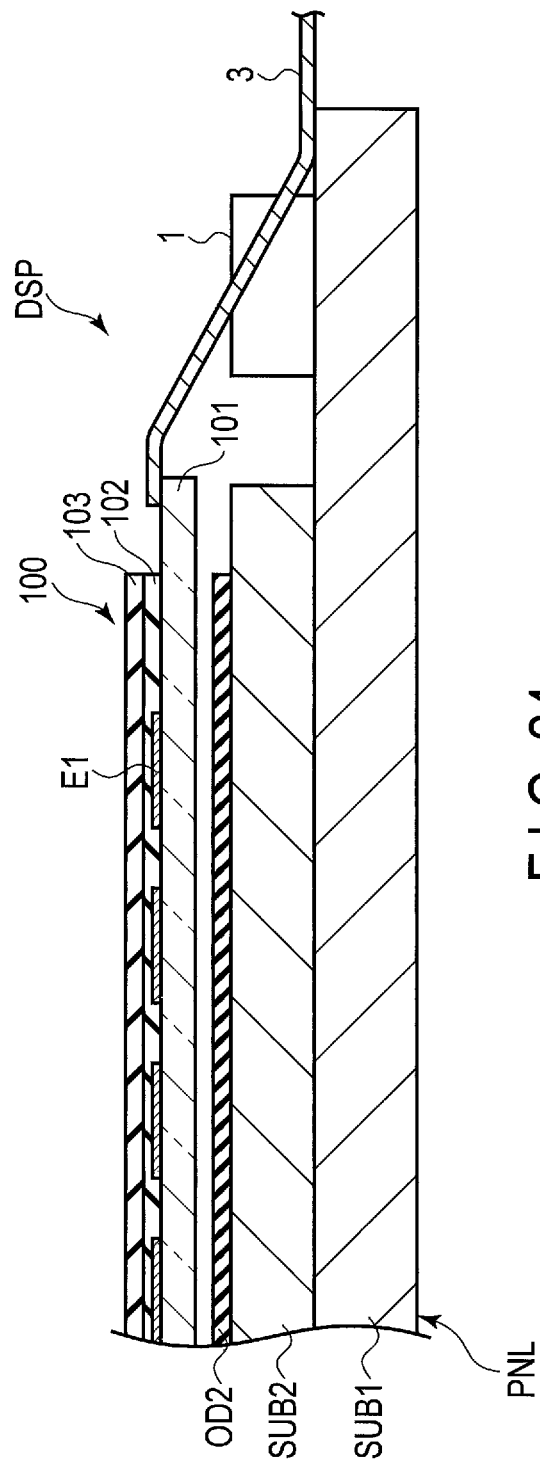
F I G. 24

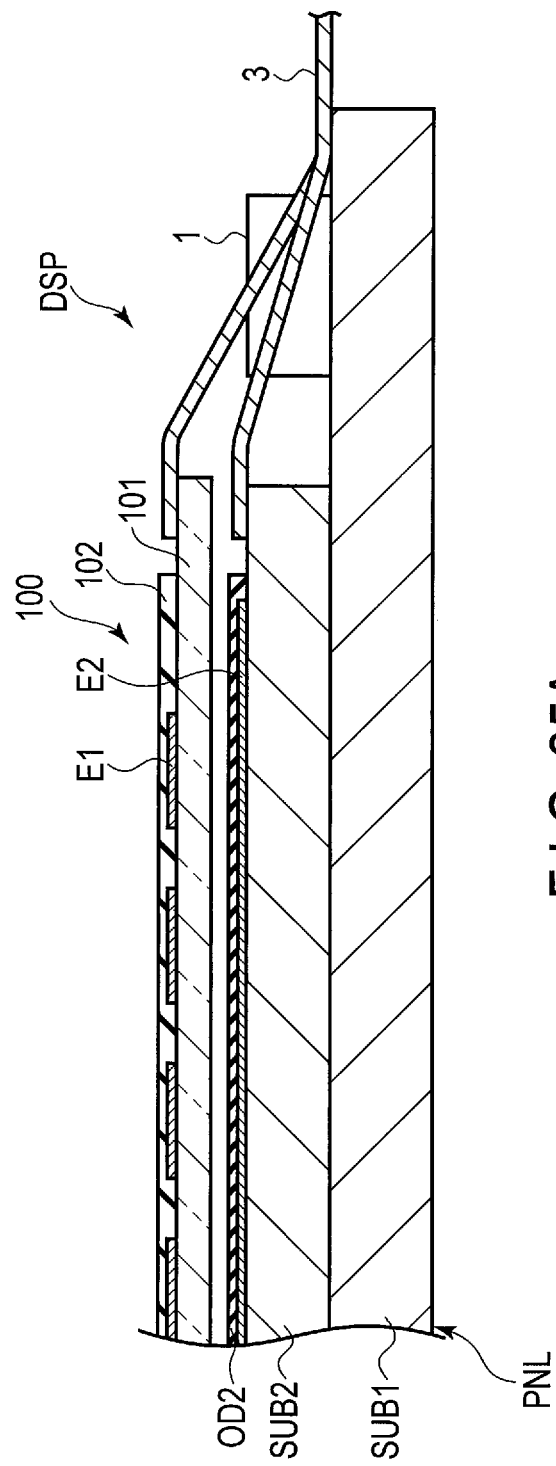
F I G. 25A

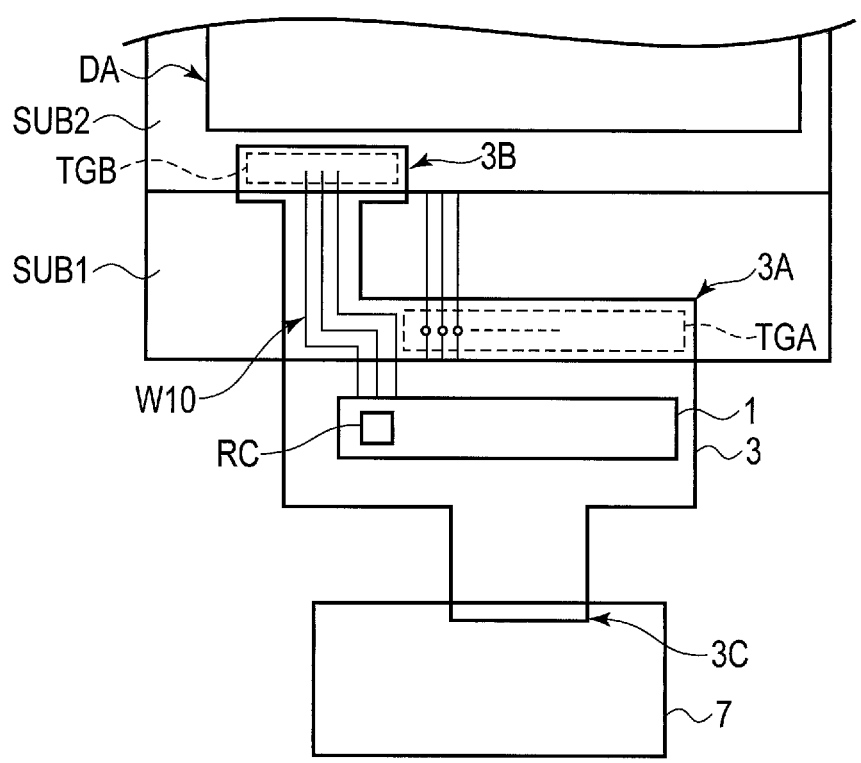
F I G. 26

SENSOR DEVICE AND SENSOR-EQUIPPED DISPLAY DEVICE

CROSS-REFERENCE TO RELATED APPLICATIONS

This application is a Continuation of application Ser. No. 15/410,633, filed Jan. 19, 2017, which is based upon and claims the benefit of priority from Japanese Patent Application No. 2016-008137, filed Jan. 19, 2016, the entire contents of which are incorporated herein by reference.

FIELD

Embodiments described herein relate generally to a sensor-equipped display device.

BACKGROUND

Recently, sensors capable of detecting contact or approach of an object such as a finger have been put into practical use as a display device interface or the like. A capacitive touch panel, which is an example of such sensors, comprises an electrode for detecting a change in the electrostatic capacitance caused by the object. In a display device including such a touch panel, in addition to a flexible printed circuit connected to a display panel, for example, a flexible printed circuit connected to a surface on which an electrode of the touch panel is formed is required.

In a structure having more than one flexible printed circuit, a connector for electrically connecting the flexible printed circuits to each other is required, and the slimness of the display device as a whole is obstructed. Also, when a display device comprising a plurality of flexible printed circuits is set in an electronic apparatus, the flexible printed circuits may contact a construct within the electronic apparatus, or may become an obstacle to installing the other constructs.

BRIEF DESCRIPTION OF THE DRAWINGS

FIG. 2 is an illustration showing a basic structure and an equivalent circuit of a display panel PNL shown in FIG. 1.

FIG. 3 is a cross-sectional view showing the structure of a part of the display panel PNL illustrated in FIG. 1.

FIG. 4A is an illustration for explaining the basic principle of a capacitive sensor SS, and is an explanatory diagram showing the state in which there is no contact or approach of an object.

FIG. 4B is an illustration for explaining the basic principle of the capacitive sensor SS, and is an explanatory diagram showing an example of an equivalent circuit of a sensor in the state illustrated in FIG. 4A.

FIG. 4C is an illustration for explaining the basic principle of the capacitive sensor SS, and is a diagram showing an example of a waveform of each of a sensor drive signal and a sensor detection signal.

FIG. 4E is a perspective view which schematically indicates the sensor SS shown in FIG. 4D.

FIG. 4F is a plan view showing another configuration example of the sensor SS.

FIG. 5B is a diagram showing major circuit blocks.

FIG. 6A is a plan view showing a configuration example of a flexible substrate 3 which is connected to a first substrate SUB1 and a second substrate SUB2.

FIG. 6B is a cross-sectional view showing a first connection portion 3A and a second connection portion 3B of the flexible substrate 3 shown in FIG. 6A.

FIG. 7 is a plan view showing another configuration example of the flexible substrate 3 which is connected to the first substrate SUB1 and the second substrate SUB2.

FIG. 8 is a plan view showing yet another configuration example of the flexible substrate 3 which is connected to the first substrate SUB1 and the second substrate SUB2.

FIG. 9 is a cross-sectional view showing a positional relationship between the flexible substrate 3 and a driving IC chip 1 in the configuration examples illustrated in FIGS. 6A and 7.

FIG. 10 is a cross-sectional view showing a positional relationship between the flexible substrate 3 and the driving IC chip 1 in the configuration example illustrated in FIG. 8.

FIG. 11 is a plan view showing yet another configuration example of the flexible substrate 3 which is connected to the first substrate SUB1 and the second substrate SUB2.

FIG. 14 is an enlarged plan view of the first substrate SUB1 opposed to an opening OPA illustrated in FIG. 11.

FIG. 18 is a cross-sectional view of the first connection portion 3A of the flexible substrate 3 shown in FIG. 16.

FIG. 19 is a cross-sectional view of the first connection portion 3A in another configuration example of the flexible substrate 3.

FIG. 20 is a cross-sectional view of the first connection portion 3A in yet another configuration example of the flexible substrate 3.

FIG. 22 is a plan view showing yet another sensor device 100.

FIG. 24 is a cross-sectional view showing another application example of the display device DSP comprising the sensor device 100.

FIG. 25A is a cross-sectional view showing yet another application example of the display device DSP comprising the sensor device 100.

FIG. 26 is a plan view showing yet another configuration example of the flexible substrate 3 which is connected to the first substrate SUB1 and the second substrate SUB2.

DETAILED DESCRIPTION

Figure 1:
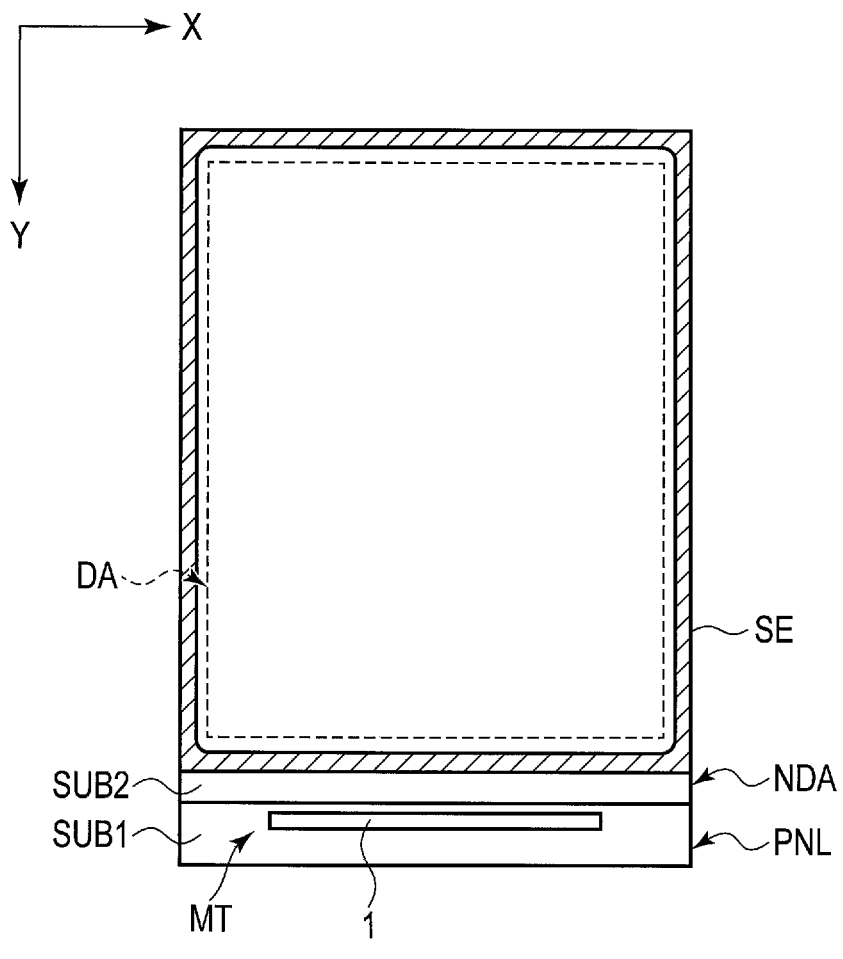
FIG. 1 is a view showing the structure of a display device DSP of the present embodiment.

In general, according to one embodiment, a sensor-equipped display device includes: a first substrate comprising a first electrode located in a display area in which an image is displayed; a second substrate comprising a second electrode which is located in the display area, and outputs a sensor signal; and a flexible substrate comprising a first connection portion connected to the first substrate and a second connection portion connected to the second substrate, the flexible substrate comprising a common base layer extending between the first connection portion and the second connection portion.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the structural elements, which have functions identical or similar to the functions described in connection with preceding drawings, are denoted by the same reference numbers, and a duplicated detailed description thereof may be arbitrarily omitted.

FIG. 1 is a view showing the structure of a display device DSP of the present embodiment. The figure shows a plan view of the display device DSP in an X-Y plane defined by a first direction X and a second direction Y which intersect each other. In the present embodiment, a liquid crystal display device is explained as an example of the display device. Note that the main structures disclosed in the present embodiment are applicable to various display devices such as a self-luminous display device with organic electroluminescent display elements and the like, an electronic paper display device with electrophoretic elements and the like, a display device employing micro-electromechanical systems (MEMS), and a display device employing electrochromism.

The display device DSP includes a display panel PNL, a driving IC chip 1 which drives the display panel PNL, etc. The display panel PNL is, for example, a liquid crystal display panel, and includes a first substrate SUB1, a second substrate SUB2, a seal portion SE, and a display function layer (a liquid crystal layer LC which will be described later). The second substrate SUB2 is opposed to the first substrate SUB1. The seal portion SE adheres the first substrate SUB1 and the second substrate SUB2.

The display panel PNL includes a display area DA in which an image is displayed, and a frame-like non-display area NDA which surrounds the display area DA. The display area DA is located at an inner side surrounded by the seal portion SE.

The driving IC chip 1 is located in the non-display area NDA. In the example illustrated, the driving IC chip 1 is mounted on a mounting portion MT of the first substrate SUB1 which extends to the outer side of the second substrate SUB2. In the driving IC chip 1, a display driver which outputs a signal necessary for displaying an image, for example, is incorporated. The display driver described in this specification includes at least a part of a signal line drive circuit SD, a scanning line drive circuit GD, and a common electrode drive circuit CD, which will be described later. Note that the driving IC chip 1 may be mounted on a flexible substrate connected to the display panel PNL separately, not limited to the illustrated example. A detailed example will be described later.

The display panel PNL of the present embodiment is a transmissive display panel having a transmissive display function of displaying an image by, for example, selectively passing light from a rear surface of the first substrate SUB1, but is not limited to this. For example, the display panel PNL may be a reflective display panel having a reflective display function of displaying an image by selectively reflecting light from a front surface of the second substrate SUB2, or a transflective display panel including both the transmissive display function and the reflective display function.

FIG. 2 is an illustration showing a basic structure and an equivalent circuit of the display panel PNL shown in FIG. 1. The display panel PNL includes a plurality of pixels PX in the display area DA. Here, the pixel indicates a minimum unit which can be individually controlled in accordance with a pixel signal, and exists, for example, in an area including a switching element arranged at a crossing point of a scanning line and a signal line which will be described later. The pixels PX are arrayed in a matrix in the first direction X and the second direction Y. Also, the display panel PNL includes scanning lines G (G1 to Gn), signal lines S (S1 to Sm), a common electrode CE, etc., in the display area DA. The scanning lines G extend in the first direction X, and are arranged in the second direction Y. The signal lines S extend in the second direction Y, and are arranged in the first direction X. Note that the scanning lines G and the signal lines S do not necessarily extend linearly, and may be partially bent. The common electrode CE is disposed over the pixels PX.

The signal line drive circuit SD, the scanning line drive circuit GD, and the common electrode drive circuit CD may be formed on the first substrate SUB1 illustrated in FIG. 1 in the non-display area NDA, or these circuits may be partly or entirely incorporated in the driving IC chip 1 illustrated in FIG. 1. Also, the layout of these drive circuits is not limited to the example illustrated.

The scanning lines G are drawn to the non-display area NDA, and are connected to the scanning line drive circuit GD. The signal lines S are drawn to the non-display area NDA, and are connected to the signal line drive circuit SD. The common electrode CE is drawn to the non-display area NDA, and is connected to the common electrode drive circuit CD.

Each of the pixels PX comprises a switching element SW, a pixel electrode PE, the common electrode CE, the liquid crystal layer LC, and the like. The switching element SW is constituted by a thin-film transistor (TFT), for example, and is electrically connected to the scanning line G and the signal line S. More specifically, the switching element SW includes a gate electrode, a source electrode, and a drain electrode. The gate electrode is electrically connected to the scanning ling G. One of the source electrode and the drain electrode is electrically connected to the signal line S. The other one of the source electrode and the drain electrode is electrically connected to the pixel electrode PE. The scanning line G is connected to the switching elements SW of the respective pixels PX arranged in the first direction X. The signal line S is connected to the switching elements SW of the respective pixels PX arranged in the second direction Y. Each pixel electrode PE is opposed to the common electrode CE, and drives the liquid crystal layer LC by an electric field produced between the pixel electrode PE and the common electrode CE. A storage capacitance CS is formed between, for example, the common electrode CE and the pixel electrode PE.

FIG. 3 is a cross-sectional view showing the structure of a part of the display panel PNL illustrated in FIG. 1. The figure illustrates a cross-section of the display device DSP taken along the first direction X. In the following explanation, a direction from the first substrate SUB1 toward the second substrate SUB2 is referred to as upward (or merely above), and a direction from the second substrate SUB2 toward the first substrate SUB1 is referred to as downward (or merely below). A view from the second substrate SUB2 toward the first substrate SUB1 is called a planar view.

The illustrated display panel PNL has a structure corresponding to a display mode mainly using a lateral electric field which is substantially parallel to the main surface of the substrate, but the structure is not particularly limited. The display panel may have a structure corresponding to a display mode using a longitudinal electric field perpendicular to the main surface of the substrate, an oblique electric field inclined to the main surface of the substrate, or a combination of these electric fields. In the display mode using the lateral electric field, a structure including both the pixel electrodes PE and the common electrode CE on one of the first substrate SUB1 and the second substrate SUB2, for example, can be applied. In the display mode using the longitudinal electric field or the oblique electric field, a structure in which one of the pixel electrode PE and the common electrode CE is provided in the first substrate SUB1, and the other one of the pixel electrode PE and the common electrode CE is provided in the second substrate SUB2, for example, can be applied. It should be noted that the main surface of the substrate is a surface parallel to the X-Y plane.

The first substrate SUB1 includes a first insulating substrate 10, the signal lines S, the common electrode CE, the pixel electrode PE, a first insulating film 11, a second insulating film 12, a third insulating film 13, a first alignment film AL1, and the like. Note that illustrations of the switching element, the scanning line, and various other insulating films interposed between the switching element and the scanning line are omitted.

The first insulating substrate 10 is a light transmissive substrate such as a glass substrate or a resin substrate. The first insulating film 11 is located on the first insulating substrate 10. The signal lines S are located on the first insulating film 11. The second insulating film 12 is located on the signal lines S and the first insulating film 11. The common electrode CE is located on the second insulating film 12. The third insulating film 13 is located on the common electrode CE and the second insulating film 12. The pixel electrode PE is located on the third insulating film 13. The pixel electrode PE is opposed to the common electrode CE via the third insulating film 13. Furthermore, the pixel electrode PE has a slit SL at a position opposed to the common electrode CE. The common electrode CE and the pixel electrode PE are formed of a transparent conductive material such as indium-tin-oxide (ITO) or indium-zinc-oxide (IZO). The first alignment film AL1 covers the pixel electrode PE and the third insulating film 13.

Note that the pixel electrode PE may be located between the second insulating film 12 and the third insulating film 13, and the common electrode CE may be located between the third insulating film 13 and the first alignment film AL1. In this case, the pixel electrode PE is formed in a plate shape not including a slit in each pixel, and the common electrode CE includes slits opposed to the pixel electrode PE. Also, both of the pixel electrode PE and the common electrode CE may be arranged in the first direction X. For example, the pixel electrode PE and the common electrode CE may be both formed in a comb-like shape, and arranged so that they are engaged with each other. In such an arrangement, for example, the third insulating film which has been illustrated may be omitted, and both of the pixel electrode PE and the common electrode CE may be located between the second insulating film 12 and the first alignment film AL1. Alternatively, one of the pixel electrode PE and the common electrode CE may be located between the second insulating film 12 and the third insulating film 13, and the other one of the pixel electrode PE and the common electrode CE may be located between the third insulating film 13 and the first alignment film AL1.

The second substrate SUB2 comprises a second insulating substrate 20, a light-shielding layer BM, a color filter CF, an overcoat layer OC, a second alignment film AL2, etc.

The second insulating substrate 20 is a light transmissive substrate such as a glass substrate or a resin substrate. The light-shielding layer BM and the color filter CF are located on the second insulating substrate 20 on the side opposed to the first substrate SUB1. The light-shielding layer BM is arranged at positions which delimit the pixels and are opposed to the signal lines S in the drawing. The color filter CF is arranged at a position opposed to the pixel electrode PE, and a part of the color filter CF overlaps the light-shielding layer BM. The color filter CF includes a red color filter, a green color filter, a blue color filter, and the like. The overcoat layer OC covers the color filter CF. The second alignment film AL2 covers the overcoat layer OC.

Note that the color filter CF may be arranged in the first substrate SUB1. Alternatively, instead of arranging the light-shielding layer BM, two or more color filters of different colors may be stacked on one another to reduce the transmittance, so that the stacked color filters function as a light-shielding layer. The color filters CF that are formed may be color filters of four colors or more. That is, a white color filter or an uncolored resin material may be disposed on a pixel which exhibits white color, or the overcoat layer OC may be disposed without arranging any color filter.

A sensor mounted in the display device DSP of the present embodiment comprises a detection electrode Rx. In the example illustrated, the detection electrode Rx is located on an outer surface SBA of the second substrate SUB2. The detection electrode Rx is formed of a metal material such as aluminum (Al), titan (Ti), silver (Ag), molybdenum (Mo), tungsten (W), copper (Cu), or chrome (Cr), an alloy formed by combining these metal materials, a transparent oxide material such as ITO or IZO, a conductive organic material, a dispersing element of a fine conductive substance or the like. Also, the detection electrode Rx may be a stacked layer body formed of a plurality of layers obtained by using one or more of the above metal materials. When a metal conductive material is used for the detection electrode Rx, it is more suitable to perform an invisibility enabling process such as a mesh process or a plating process with a black material.

A first optical element OD1 including a first polarizer PL1 is located between the first insulating substrate 10 and an illuminating unit BL. A second optical element OD2 including a second polarizer PL2 is located on the detection electrode Rx. Each of the first optical element OD1 and the second optical element OD2 may include a retardation film as needed. The first polarizer PL1 and the second polarizer PL2 are disposed to be, for example, in a crossed-Nicol relationship in which absorption axes of the respective polarizers are orthogonal to each other.

Next, a configuration example of a sensor SS mounted in the display device DSP of the present embodiment will be described. The sensor SS which will be described below is, for example, a mutual-capacitive sensor, which detects contact or approach of an object to be detected, based on a variation in the electrostatic capacitance between a pair of electrodes opposed to each other with a dielectric interposed therebetween. Note that the sensor SS may be a photo sensor such as an infrared sensor, or an electromagnetic induction type sensor such as a digitizer.

The basic principle of the capacitive sensor SS will be described with reference to FIGS. 4A to 4C. FIG. 4A is an explanatory diagram showing the state in which there is no contact or approach of an object. FIG. 4B is an explanatory diagram showing an example of an equivalent circuit of a sensor in the state illustrated in FIG. 4A. FIG. 4C is a diagram showing an example of a waveform of each of a sensor drive signal and a sensor detection signal. Note that in the following, a case where a finger, which is the object to be detected, contacts or approaches a touch detection surface is explained. However, the object to be detected is not limited to a finger, and may be, for example, an object including a conductor such as a stylus pen.

For example, as shown in FIG. 4A, a capacitive element CP which constitutes the sensor SS includes a pair of electrodes arranged to be opposed to each other with a dielectric D interposed therebetween, that is, a sensor driving electrode Tx and a detection electrode Rx. As shown in FIG. 4B, an end of the capacitive element CP (i.e., the sensor driving electrode Tx) is connected to an alternating-current signal source (drive signal source) SGS, and the other end (i.e., the detection electrode Rx) is connected to a voltage detector (detecting unit) DET. The voltage detector DET is, for example, an integrating circuit.

When an alternating-current rectangular wave Sg of a predetermined frequency (for example, about several kilohertz to several hundreds of kilohertz) is applied from the alternating-current signal source SGS to the sensor driving electrode Tx, an output waveform Vdet as shown in FIG. 4C appears via the voltage detector DET connected to the detection electrode Rx. Note that the alternating-current rectangular wave Sg corresponds to a sensor drive signal Txs input from the common electrode drive circuit CD. The output waveform Vdet corresponds to a sensor detection signal Rxs. A sensor signal corresponds to the sensor drive signal Txs or the sensor detection signal Rxs.

In a state in which the finger does not contact or approach the touch detection surface (i.e., non-contact state), as shown in FIG. 4B, a current $I_0$ according to a capacitance value of the capacitive element CP flows as the capacitive element CP is charged and discharged. The voltage detector DET as shown in the drawing converts a variation in the current $I_0$ according to the alternating-current rectangular wave Sg into a variation in voltage, and the sensor detection signal Rxs having waveform $V_0$ shown by a solid line in FIG. 4C is output.

Meanwhile, in a state in which the finger contacts (or approaches) the touch detection surface (i.e., contact state), since an electrostatic capacitance formed by the finger contacts the detection electrode Rx or is close to the detection electrode Rx, an electrostatic capacitance of a fringe field which exists between the sensor driving electrode Tx and the detection electrode Rx is blocked. Accordingly, the capacitive element CP in the contact state serves as a capacitive element having a smaller capacitance value than that in the non-contact state. Further, a current which varies according to a change in the capacitance value of the capacitive element CP flows. At this time, the sensor detection signal Rxs having waveform $V_1$ as shown by a dotted line in FIG. 4C is output. In this case, waveform $V_1$ has a smaller amplitude as compared to waveform $V_0$ described above. Thereby, the absolute value $|\Delta V|$ of a voltage difference between waveform $V_0$ and waveform $V_1$ is to be changed in accordance with the effect of contact or approach of an object such as a finger. Further, in order for the voltage detector DET to accurately detect the absolute value $|\Delta V|$ of the voltage difference between waveform $V_0$ and waveform $V_1$, preferably, by the switching of the voltage detector DET, the operation should include a period Reset in which charge and discharge of a capacitor is reset in accordance with the frequency of the alternating-current rectangular wave Sg.

As described above, the sensor SS sequentially performs the scan for each detection block in accordance with the sensor drive signal Txs supplied from the common electrode drive circuit CD, and contact or approach of the object is detected (sensed). The sensor SS outputs the sensor detection signal Rxs for each detection block via the voltage detector DET shown in FIG. 4B from a plurality of detection electrodes Rx which will be described later.

Figure 4D:
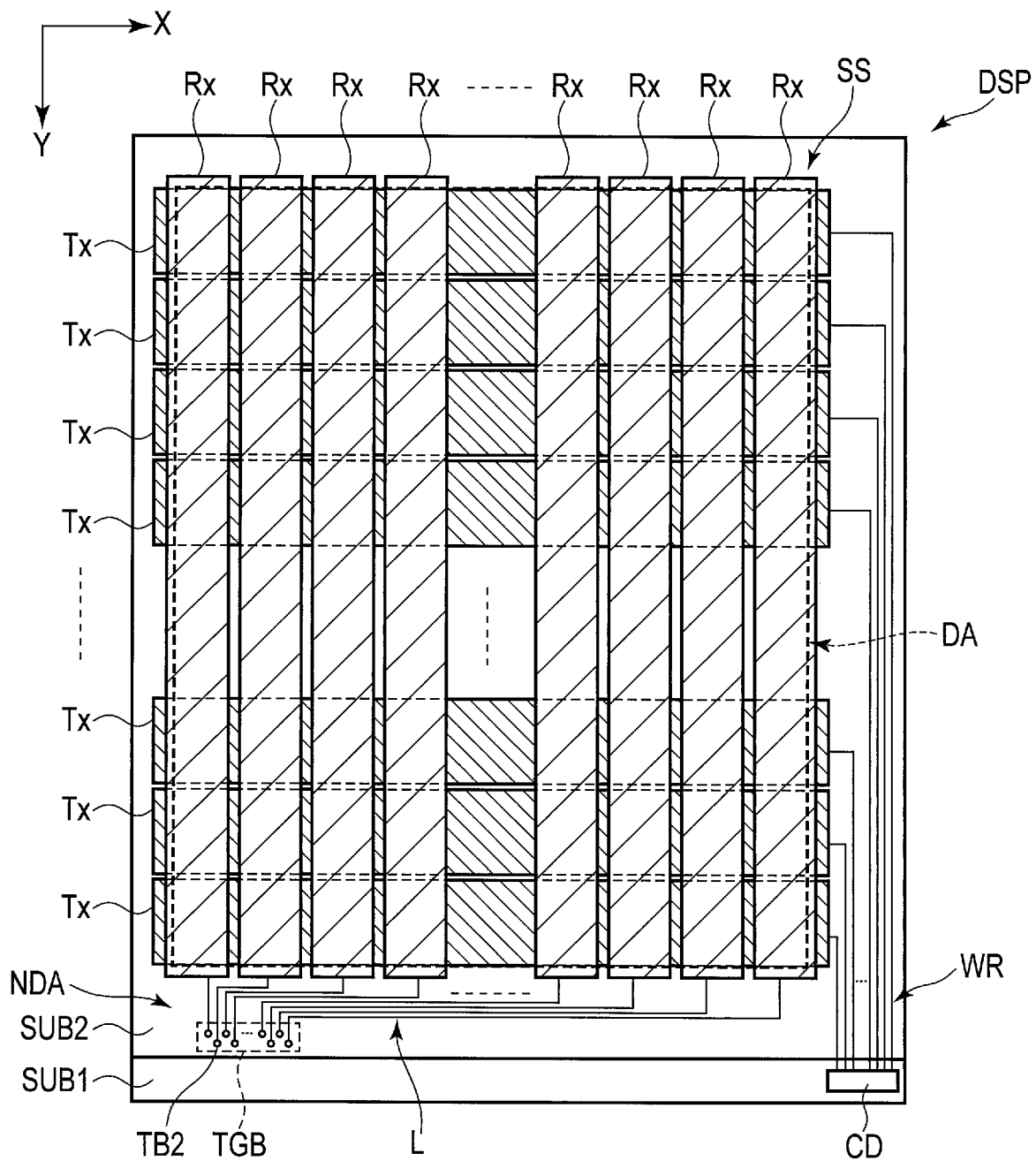
FIG. 4D is a plan view showing a configuration example of the sensor SS.

FIG. 4D is a plan view showing a configuration example of the sensor SS.

In the present embodiment, the sensor SS comprises the sensor driving electrode Tx, the detection electrode Rx, a lead line L, and a connection line WR. The sensor driving electrode Tx includes the common electrode CE, has the function of producing an electric field between the sensor driving electrode Tx and the pixel electrode PE, and also has the function for detecting a position of an object by producing a capacitance between the sensor driving electrode Tx and the detection electrode Rx.

The sensor driving electrodes Tx and the detection electrodes Rx are located in the display area DA. In the example illustrated, the sensor driving electrodes Tx are each formed in a strip shape extending in the first direction X, and are arranged to be spaced apart from each other in the second direction Y. Also, the detection electrodes Rx are each formed in a strip shape extending in the second direction Y, and are arranged to be spaced apart from each other in the first direction X. That is, the sensor driving electrodes Tx and the detection electrodes Rx cross each other in planar view. Note that the number, size, and shape of the sensor driving electrode Tx and the detection electrode Rx are not particularly limited, and can be changed variously. The sensor driving electrodes Tx and the detection electrodes Rx may extend to the non-display area NDA. The shape of each of the sensor driving electrodes Tx and the detection electrodes Rx is not limited to a strip, but the other shapes such as a comb-like shape may be adopted. Alternatively, it suffices that the sensor driving electrodes Tx and the detection electrodes Rx are formed as separate elements, and the shape of a slit which separates between the sensor driving electrodes Tx may be linear or curved.

The lead lines L and the connection lines WR are disposed in the non-display area NDA. The lead lines L are located on the same surface as the one that the detection electrodes Rx are located on (for example, the outer surface SBA shown in FIG. 3) in the second substrate SUB2. Preferably, such lead lines L should be formed of a metal material having low resistance. One end of each of the lead lines L is electrically connected to the corresponding one of the detection electrodes Rx. The other end of each of the lead lines L is electrically connected to the corresponding one of terminals TB2 in a terminal group TGB. The connection lines WR are provided on the first substrate SUB1. One end of each of the connection lines WR is electrically connected to the corresponding one of the sensor driving electrodes Tx. The other end of each of the connection lines WR is electrically connected to the common electrode drive circuit CD.

Note that the layout of the lead lines L and the connection lines WR is not limited to the example illustrated. For example, the connection lines WR connected to the odd-numbered sensor driving electrodes Tx among a plurality of sensor driving electrodes Tx may be located in the non-display area NDA on one side (for example, the non-display NDA on the right side of the display area DA), and the connection lines WR connected to the even-numbered sensor driving electrodes Tx may be located in the non-display area NDA on the other side (for example, the non-display NDA on the left side of the display area DA). Alternatively, the connection lines WR connected to the sensor driving electrodes Tx located on the upper half of the display area DA may be located in the non-display area NDA on one side, and the connection lines WR connected to the sensor driving electrodes Tx located on the lower half of the display area DA may be located in the non-display area NDA on the other side.

The common electrode drive circuit CD supplies a common drive signal to the sensor driving electrode Tx including the common electrode CE at a display drive time in which an image is displayed.

Also, the common electrode drive circuit CD supplies a sensor drive signal to each of the sensor driving electrodes Tx at a sensing drive time in which sensing is performed to detect contact or approach of the object. Each of the detection electrodes Rx outputs a sensor detection signal necessary for sensing (that is, a signal based on a change in the interelectrode capacitance between the sensor driving electrode Tx and the detection electrode Rx) in accordance with supply of the sensor drive signals to the sensor driving electrodes Tx.

FIG. 4E is a perspective view which schematically indicates the sensor SS shown in FIG. 4D.

The sensor driving electrodes Tx have stripe electrode patterns extending in the first direction X, respectively. The detection electrodes Rx have stripe electrode patterns extending in the second direction Y, respectively, and intersect the sensor driving electrodes Tx, respectively. The detection electrodes Rx are opposed to the sensor driving electrodes Tx in a third direction Z which intersects the first direction X and the second direction Y. A portion where the sensor driving electrode Tx and the detection electrode Rx are opposed to each other corresponds to the capacitive element CP shown in FIG. 4A, and an electrostatic capacitance is formed at the intersection.

In the sensor SS having such a structure, in the sensing drive time, the common electrode drive circuit CD drives the sensor driving electrodes Tx such that they are sequentially scanned in a time-sharing manner. In this way, the detection block constituted by at least one sensor driving electrode Tx is selected one by one in a scanning direction shown by an arrow in the drawing. The detection block constituted by the selected sensor driving electrode Tx is supplied with the sensor drive signal Txs by the common electrode drive circuit CD. Further, as the sensor detection signal Rxs is output from the detection electrode Rx, sensing of one detection block is carried out. Here, the detection block constituted by at least one sensor driving electrode Tx includes the electrode pattern of one or more sensor driving electrodes Tx, and a plurality of detection blocks extend in a direction along the direction in which the respective sensor driving electrodes Tx extend, and are arranged in the scanning direction.

In the sensor SS illustrated, the detection electrodes Rx and the sensor driving electrode Tx which intersect each other constitute a capacitive touch sensor in a matrix. Thus, by performing the scanning throughout the entire touch detection surface of the sensor SS, a position at which an object (a conductor) has made contact or approach externally can be detected.

FIG. 4F is a plan view showing another configuration example of the sensor SS. The configuration example illustrated in FIG. 4F is different from the configuration example illustrated in FIG. 4D in that while the sensor driving electrodes Tx are arranged to be spaced apart from each other in the first direction X and extend the second direction Y, the detection electrodes Rx are arranged to be spaced apart from each other in the second direction Y and extend the first direction X. Also in this configuration example, the sensor driving electrodes Tx and the connection lines WR are provided on the first substrate SUB1, and the detection electrodes Rx and the lead lines L are provided on the second substrate SUB2. The other elements are the same as those of the configuration example illustrated in FIG. 4D, and thus the same reference numbers will be added for those elements and explanations of them will be omitted.

Note that the layout of the lead lines L and the connection lines WR is not limited to the example illustrated. For example, of the lead lines L, the lead lines L connected to the odd-numbered detection electrodes Rx may be located in the non-display area NDA on one side (for example, the non-display NDA on the right side of the display area DA), and the lead lines L connected to the even-numbered detection electrodes Rx may be located in the non-display area NDA on the other side (for example, the non-display NDA on the left side of the display area DA). Alternatively, the lead lines L connected to the detection electrodes Rx located on the upper half of the display area DA may be located in the non-display area NDA on one side, and the lead lines L connected to detection electrodes Rx located on the lower half of the display area DA may be located in the non-display area NDA on the other side.

Figure 5A:
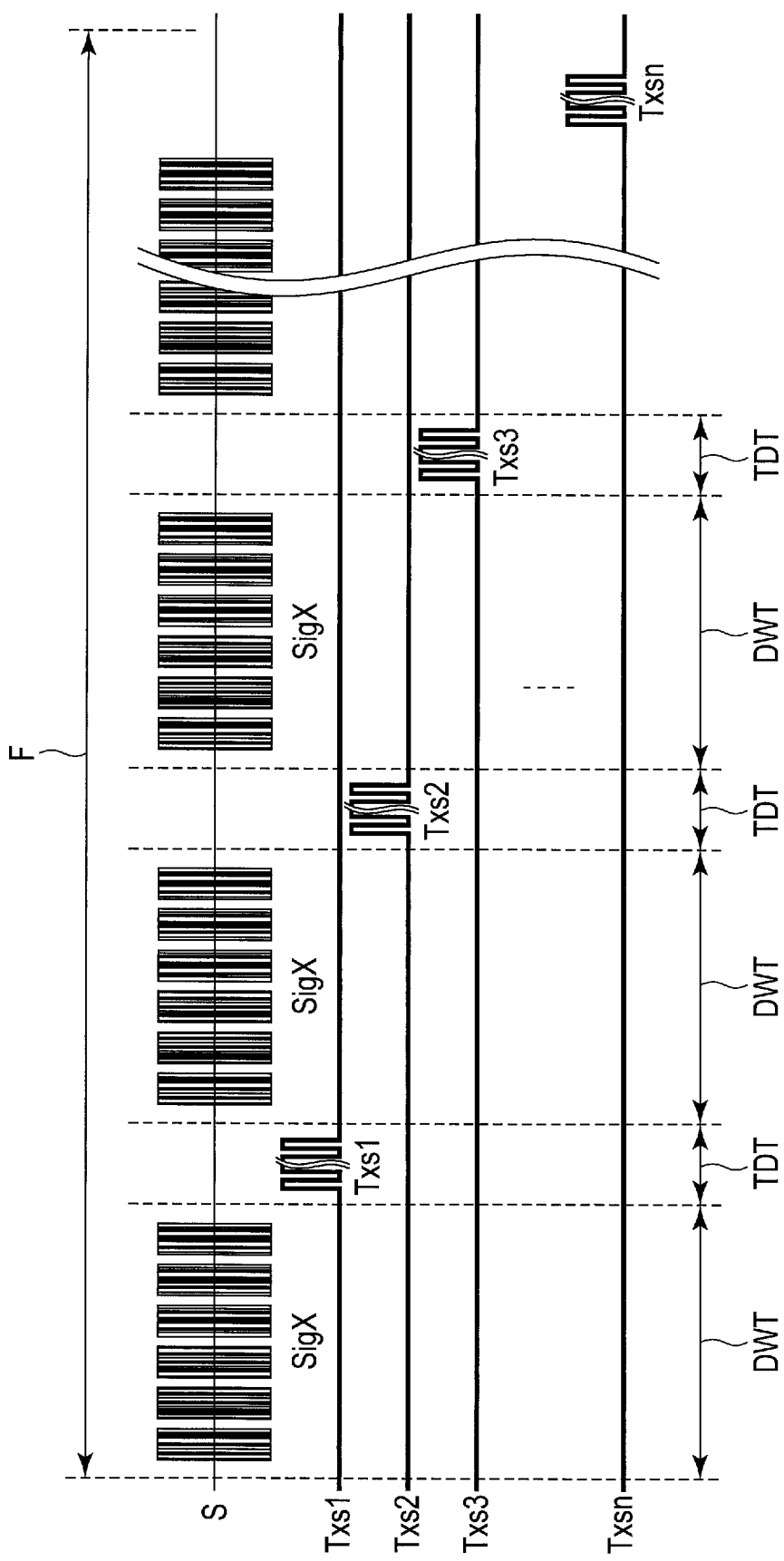
FIG. 5A shows a timing chart when a sensor driving electrode Tx is driven by a sensor drive signal Txs.

FIG. 5A shows a timing chart when the sensor driving electrode Tx is driven by the sensor drive signal Txs. In one frame period F, a display period DWT (including a period of writing a pixel signal SigX from the signal line S) and a detection period TDT in which sensing is performed are set in different periods. More specifically, one frame period F includes a plurality of display periods DWT, and the detection period TDT is set between one display period DWT and another display period DWT. In each of the detection periods TDT, detection blocks Tx1, Tx2, Tx3, . . . , of the sensor driving electrodes Tx are driven by the sensor drive signals Txs1, Txs2, Txs3, . . . , etc. Note that one detection block is a unit including an electrode pattern of one or more sensor driving electrodes Tx, as described above.

When the detection blocks Tx1, Tx2, Tx3, . . . of the sensor driving electrodes Tx are driven by the sensor drive signals Txs1, Txs2, Txs3, . . . , if the object is close to the touch detection surface, a low-level sensor detection signal Rxs is output from the detection electrode Rx corresponding to a position of the object. The display periods DWT and the touch detection periods TDT are distributed at different points in one frame period F. That is, the display periods DWT and the touch detection periods TDT are time-shared in one frame period F.

FIG. 5B is a diagram showing major circuit blocks.

Pixel data and a synchronization signal output from a host device HOS can be received by an interface circuit 701. The pixel data received by the interface circuit 701 is input to a data processing circuit 702 and subjected to data interpolation and/or synthesis so that the data conforms to the display by the display panel PNL. A timing generator circuit 712 receives a vertical synchronization signal and/or a horizontal synchronization signal. The timing generator circuit 712 includes a phase control circuit, and controls and maintains the relationship between a phase of a clock (internal clock) of an internal oscillator 711 and a phase of an external synchronization signal in a predetermined relationship. Further, the timing generator circuit 712 generates an internal horizontal synchronization pulse and an internal vertical synchronization pulse based on the internal clock.

The internal horizontal synchronization pulse, the internal vertical synchronization pulse, and various timing pulses for driving are input to an LCD drive circuit 713 and a touch panel drive circuit 715. Further, the timing generator circuit 712 generates and supplies a timing pulse to each of the interface circuit 701, the data processing circuit 702, a video memory 703, a display line data latch circuit 704, and a source amplifier 705. Each block in the driving IC chip 1 is thereby uniformly controlled. Thus, the timing generator circuit 712 can also be called a control unit in the driving IC chip 1.

The pixel data output from the data processing circuit 702 is latched into the display line data latch circuit 704. The pixel data latched into the display line data latch circuit 704 is subjected to analog conversion in the source amplifier 705 and becomes pixel signals. The pixel signals are then subjected to gamma correction and supplied to the display panel. These pixel signals are written to conductive pixels through the signal lines S1 to S1080.

The LCD drive circuit 713 can control a source selection circuit (not shown) and a gate circuit (not shown) based on a timing signal from the timing generator circuit 712 to designate a line to which the pixel signal is to be written. The touch panel drive circuit 715 supplies the drive signal Txs shown in FIG. 5A to the detection block of the sensor driving electrode Tx in the allocated time. The sensor detection signal Rxs is thereby output from the detection electrode Rx. The touch panel drive circuit 715 in this explanation is included in the above common electrode drive circuit CD.

The sensor detection signal Rxs is input to a detection circuit RC which functions as, for example, a touch panel controller. The driving IC chip 1 may be constituted of a plurality of IC chips. For example, the driving IC chip 1 may include a first IC chip including at least the detection circuit RC, and a second IC chip including at least the touch panel drive circuit 715. Also, the detection circuit RC may be incorporated in the driving IC chip 2 different from the driving IC chip 1. The driving IC chip 2 may be mounted on the flexible substrate. This point will be described in detail later in a configuration example. The detection circuit RC detects a position of contact or approach of the object based on temporal association between a drive timing of the sensor drive signal Txs and a detection timing of the sensor detection signal Rxs. A result of detection of the position of the object (i.e., a touch position detection result) is input to the host device HOS. After determining the position of the object, the host device HOS executes a program operation set next based on the determination result.

The detection circuit RC can give a switching signal (also called a condition signal) to the timing generator circuit 712. The switching signal corresponds to a signal for switching a touch detection frequency. When the sensor detection signal Rxs of a predetermined level cannot be obtained in a normal operation, for example, the detection circuit RC gives a switching signal to set the touch detection frequency to 120 Hz, for example, to the timing generator circuit 712. The touch detection frequency is a frequency at which a display surface (touch detection surface) is scanned in a period of one frame (60 Hz). Further, if any noise (sensor detection signal Rxs) is detected, the detection circuit RC gives a signal for switching the touch detection frequency to the timing generator circuit 712. In response to this switching signal, the timing generator circuit 712 controls the touch panel drive circuit 715 to set the touch detection frequency to 60 Hz. Thereby, a touch detection time can be set longer, and the sensitivity of touch detection can be improved. If the sensor detection signal is not input for a certain time, the detection circuit RC can set the touch detection frequency to 120 Hz through the timing generator circuit 712. In this manner, in the present device, the touch detection frequency may be switched depending on conditions.

When the sensor driving electrode Tx is provided on the first substrate SUB1, and the detection electrode Rx is provided on the second substrate SUB2, the terminal TB2 is electrically connected to the detection electrode Rx. Accordingly, the terminal TB2 for outputting the sensor signal outputs the sensor detection signal Rxs output from the detection electrode Rx to the detection circuit RC as the sensor signal. Also, when the sensor driving electrode Tx is provided on the second substrate SUB2, and the detection electrode Rx is provided on the first substrate SUB1, the terminal TB2 is electrically connected to the sensor driving electrode Tx. Accordingly, the terminal TB2 for outputting the sensor signal outputs the sensor drive signal Txs output from the touch panel drive circuit 715 to the sensor driving electrode Tx as the sensor signal.

FIG. 6A is a plan view showing a configuration example of a flexible substrate 3 which is connected to the first substrate SUB1 and the second substrate SUB2. It is sufficient if the flexible substrate applicable to the present embodiment is structured as a flexible portion in which a bendable material is used for at least a portion to be bent. For example, the flexible substrate 3 may be constituted as a flexible substrate which is entirely structured as a flexible portion, or a rigid flexible substrate comprising a rigid portion formed of a hard material such as glass epoxy, and a flexible portion formed of a bendable material such as polyimide.

The flexible substrate 3 comprises a first connection portion 3A, a second connection portion 3B, and a third connection portion 3C. The first connection portion 3A corresponds to a region where the flexible substrate 3 and the first substrate SUB1 overlap one another in planar view. The second connection portion 3B corresponds to a region where the flexible substrate 3 and the second substrate SUB2 overlap one another in planar view. The third connection portion 3C corresponds to a region where the flexible substrate 3 and the external circuit board 7 overlap one another in planar view. The first connection portion 3A is arranged at a position which overlaps a terminal group TGA, and is connected to the first substrate SUB1. The second connection portion 3B is arranged at a position which overlaps the terminal group TGB, and is connected to the second substrate SUB2. The third connection portion 3C is connected to an external circuit board 7. The external circuit board 7 corresponds to the host device HOS shown in FIG. 5B, for example. The external circuit board 7 outputs pixel data and a synchronization signal to the driving IC chip 1, and a detection result of the position of an object from the detection circuit RC is input to the external circuit board 7.

The flexible substrate 3 as described above does not overlap the driving IC chip 1 in planar view between the first connection portion 3A and the second connection portion 3B.

In the example illustrated, the flexible substrate 3 comprises an IC chip 5 and a connection line W10. The IC chip 5 is mounted on the flexible substrate 3. The connection line W10 electrically connects the second connection portion 3B and the IC chip 5. In the IC chip 5, the detection circuit RC is incorporated. The detection circuit RC is electrically connected to the detection electrodes Rx shown in FIG. 4, etc., via the connection lines W10, etc. The detection circuit RC reads a sensor detection signal output from the detection electrode Rx, and detects the presence or absence of contact or approach of the object and also position coordinates, etc., of the object.

FIG. 6B is a cross-sectional view showing the first connection portion 3A and the second connection portion 3B of the flexible substrate 3 shown in FIG. 6A.

The first substrate SUB1 includes a first area A1 opposed to the second substrate SUB2, and a second area A2 not opposed to the second substrate SUB2. A terminal TA1 in the terminal group TGA of the first substrate SUB1 is located in the second area A2. The terminal TB2 in the terminal group TGB of the second substrate SUB2 is located in the first area A1. The terminal TA1 corresponds to a first terminal. The terminal TB2 corresponds to a second terminal.

The flexible substrate 3 overlaps each of the first area A1 and the second area A2, and extends to an outer side of an overlapping position of the flexible substrate 3 and the first substrate SUB1. The first connection portion 3A overlaps the first area A1, and the second connection portion 3B overlaps the second area A2. The flexible substrate 3 comprises a common base layer 30 extending between the first connection portion 3A and the second connection portion 3B. Also, the flexible substrate 3 comprises a conductive layer 31, a cover layer 32, etc. The conductive layer 31 is located on the base layer 30 at the side opposed to the display panel PNL, in other words, at the side opposed to the first substrate SUB1. The conductive layer 31 includes a terminal TA31 located in the first connection portion 3A, a terminal TB31 located in the second connection portion 3B, and the like. The terminal TA31 corresponds to a part of a third conductive layer. The cover layer 32 covers the conductive layer 31. Note that the cover layer 32 includes openings OPA and OPB, which expose the conductive layer 31, in the first connection portion 3A and the second connection portion 3B, respectively.

In the first connection portion 3A, the terminal TA31 of the flexible substrate 3 is electrically connected to the terminal TA1 of the terminal group TGA of the first substrate SUB1 via a conductive adhesive layer 4A. In the second connection portion 3B, the terminal TB31 of the flexible substrate 3 is electrically connected to the terminal TB2 of the terminal group TGB of the second substrate SUB2 via a conductive adhesive layer 4B. Note that the terminal TB2 is located on the surface SBA, which is the same surface as the one that the detection electrodes Rx and the lead lines L are located on. Each of the conductive adhesive layers 4A and 4B is, for example, an anisotropic conductive film in which conductive particles are dispersed in an adhesive.

According to the present embodiment, the flexible substrate 3 comprises the first connection portion 3A connected to the first substrate SUB1 comprising electrodes for display, and the second connection portion 3B connected to the second substrate SUB2 comprising electrodes which constitute the sensor SS. Further, the flexible substrate 3 comprises the common base layer 30 extending between the first connection portion 3A and the second connection portion 3B. That is, the first substrate SUB1 and the second substrate SUB2 are electrically connected to a single flexible substrate 3. Accordingly, as compared to a case where the first substrate SUB1 and the second substrate SUB2 are connected to different flexible substrates, respectively, the number of flexible substrates can be reduced, and not only the structure can be simplified, but the cost can be reduced.

Also, since the flexible substrate 3 which is connected to the first substrate SUB1 and the second substrate SUB2 is unified, a connector for electrically connecting a plurality of flexible substrates to each other becomes unnecessary, whereby the display device can be made small and thin.

Furthermore, when the display device DSP to which the flexible substrate 3 is connected is set in an electronic apparatus, a construct within the electronic apparatus and the flexible substrate 3 can be prevented from being in contact with each other, and thus, the construct can be installed at a desired position.

Next, another configuration example will be described.

FIG. 7 is a plan view showing another configuration example of the flexible substrate 3 which is connected to the first substrate SUB1 and the second substrate SUB2.

The configuration example illustrated is different from the configuration example shown in FIG. 6A in that the IC chip 5 is omitted, and the detection circuit RC is incorporated in the driving IC chip 1. In this configuration example, the flexible substrate 3 comprises connection lines W20 for electrically connecting the first connection portion 3A and the second connection portion 3B. The connection line W20 corresponds to a third conductive layer. One end of each of the connection lines W20 includes the terminal TB31 shown in FIG. 6B, and is electrically connected the terminal group TGA of the first substrate SUB1 in the first connection portion 3A. The other end of each of the connection lines W20 includes the terminal TA31 shown in FIG. 6B, and is electrically connected the terminal group TGB of the second substrate SUB2 in the second connection portion 3B. The first substrate SUB1 comprises connection lines W21 for electrically connecting the terminal group TGA and the driving IC chip 1. The detection circuit RC of the driving IC chip 1 is electrically connected to the detection electrodes Rx shown in FIG. 4, etc., via the connection lines W20 and W21, etc.

As in the configuration example illustrated in FIG. 6A, the flexible substrate 3 of this case does not overlap the driving IC chip 1 in planar view between the first connection portion 3A and the second connection portion 3B.

Also in this configuration example, the same advantages as those of the above configuration example can be obtained. In addition, since the IC chip 5 is omitted, and the detection circuit RC is incorporated in the driving IC chip 1, the flexible substrate 3 can be made small and thin.

FIG. 8 is a plan view showing yet another configuration example of the flexible substrate 3 which is connected to the first substrate SUB1 and the second substrate SUB2.

The configuration example illustrated is different from the configuration example illustrated in FIG. 6A in that the flexible substrate 3 overlaps the driving IC chip 1 in planar view between the first connection portion 3A and the second connection portion 3B. While the connection lines W10 of the flexible substrate 3 are extended over the driving IC chip 1, they are covered by the cover layer 32 as shown in FIG.

6B, and the electric insulation is secured. The connection line W10 corresponds to a third conductive layer.

The flexible substrate 3 comprises the IC chip 5. In the IC chip 5, the detection circuit RC is incorporated. The connection lines W10 electrically connect the second connection portion 3B and the detection circuit RC. In this case, the connection lines W10 are not connected to the first substrate SUB1.

Also in this configuration example, the same advantages as those of the above configuration example can be obtained. In addition, as compared to the above configuration example, since the connection lines W10 do not need to detour around an area where the flexible substrate 3 overlaps the driving IC chip 1, the size of the flexible substrate 3 can be reduced. Also, in the configuration example illustrated, a heat radiation member may be installed on a surface of the flexible substrate 3 which is opposed to the driving IC chip 1, and this heat radiation member may be brought into contact with the driving IC chip 1. Thereby, an increase in the temperature caused by the radiation of heat of the driving IC chip 1 can be suppressed.

FIG. 9 is a cross-sectional view showing a positional relationship between the flexible substrate 3 and the driving IC chip 1 in the configuration examples illustrated in FIGS. 6A and 7. As illustrated in the drawing, the flexible substrate 3 is arranged not to overlap the driving IC chip 1 between the first connection portion 3A and the second connection portion 3B. The first connection portion 3A is connected to the same surface as the one on which the driving IC chip 1 is mounted in the first substrate SUB1. The second connection portion 3B is connected to the same surface as the one on which the detection electrodes Rx are arranged in the second substrate SUB2.

FIG. 10 is a cross-sectional view showing a positional relationship between the flexible substrate 3 and the driving IC chip 1 in the configuration example illustrated in FIG. 8. As illustrated in the drawing, the flexible substrate 3 overlaps the driving IC chip 1 between the first connection portion 3A and the second connection portion 3B. In the example illustrated, while the flexible substrate 3 is separated from the driving IC chip 1, an insulator such as the heat radiation member mentioned above may be interposed between the flexible substrate 3 and the driving IC chip 1. Further, as the flexible substrate 3, a multilayer structure substrate including a plurality of conductive layers is applicable. In such flexible substrate 3, for example, an insulating layer and a conductive layer are alternately stacked. By exposing the conductive layer not used as a connection line to the side opposed to the driving IC chip 1, this conductive layer can be used as a heat radiation member by bringing it into contact with the driving IC chip 1.

FIG. 11 is a plan view showing yet another configuration example of the flexible substrate 3 which is connected to the first substrate SUB1 and the second substrate SUB2. As has been described referring to FIG. 6B, the cover layer 32 includes the opening OPA in the first connection portion 3A. The opening OPA is formed at a position which overlaps the terminal group TGA in planar view. In the example illustrated, the opening OPA is continuously extended from one end 3D of the flexible substrate 3 to the other end 3E of the same, in the first connection portion 3A. Also, the opening OPA intersects the connection lines W10 extending from the second connection portion 3B.

Figure 12:
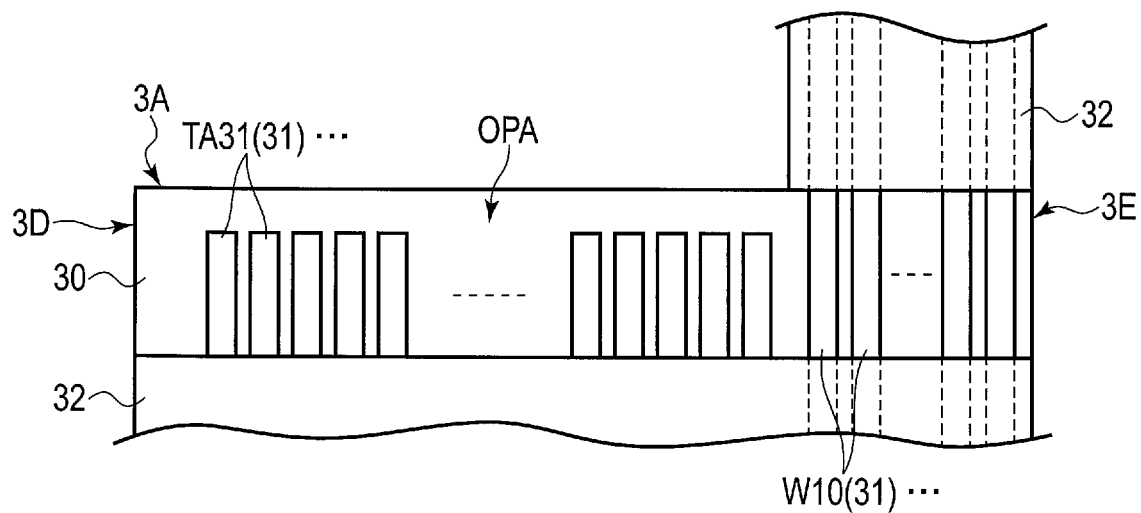
FIG. 12 is an enlarged plan view of the first connection portion 3A of the flexible substrate 3 shown in FIG. 11 as seen from the first substrate side.

FIG. 12 is an enlarged plan view of the first connection portion 3A of the flexible substrate 3 shown in FIG. 11 as seen from the first substrate side. As illustrated in the drawing, the first connection portion 3A comprises the terminals TA31 on the side close to the one end 3D, and comprises the connection lines W10 on the side close to the other end 3E. These terminals TA31 and the connection lines W10 are part of the conductive layer 31 located on the side opposed to the first substrate of the base layer 30. The cover layer 32 includes the opening OPA which exposes the conductive layer 31 from the one end 3D to the other end 3E. That is, the terminals TA31 and the connection lines W10 are exposed from the opening OPA.

The above-described flexible substrate 3 is manufactured through the following processes, for example. That is, a metal material is deposited by using a method such as sputtering to form a metal layer on the base layer 30, and after that, by patterning the metal layer, the conductive layer 31 is formed. After that, the cover layer 32 having the opening OPA, etc., is adhered to the conductive layer 31. In one example, a total thickness of the flexible substrate 3 is 45 to 150 μm, the thickness of the cover layer 32 is 20 to 30 μm, and the thickness of the conductive layer 31 is approximately 1 to 10 μm.

Figure 13:
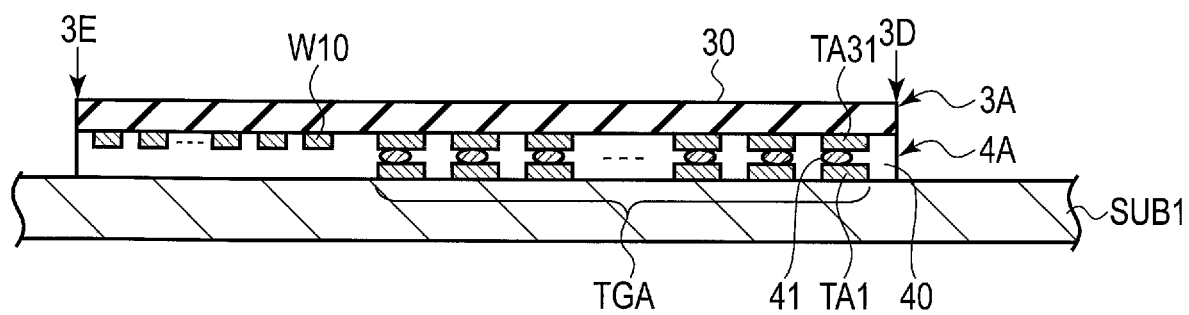
FIG. 13 is a cross-sectional view of the first connection portion 3A of the flexible substrate 3 shown in FIG. 11 from one end 3D to the other end 3E.

FIG. 13 is a cross-sectional view of the first connection portion 3A of the flexible substrate 3 shown in FIG. 11 from the one end 3D to the other end 3E. As illustrated in the drawing, the first connection portion 3A is connected to the first substrate SUB1 via the conductive adhesive layer 4A. The conductive adhesive layer 4A includes an adhesive 40, and conductive particles 41 dispersed in the adhesive 40. The terminals TA1 of the terminal group TGA of the first substrate SUB1 are opposed to the terminals TA31 of the first connection portion 3A, respectively. The conductive particles 41 contact both of the terminals TA1 and the terminals TA31, and electrically connect the two. However, in the cross-section illustrated, in the first connection portion 3A of the flexible substrate 3, not only the terminals TA1, but also the connection lines W10 are exposed. Accordingly, the terminal group TGA and a peripheral line of the first substrate SUB1 are not provided in a position opposed to the connection lines W10. Although the connection lines W10 are adhered to the first substrate SUB1 via the conductive adhesive layer 4A, the connection lines W10 are opposed to an area in which no conductive layer such as a terminal, conductive line, or the like, is provided in the first substrate SUB1. This point will be described in the following.

FIG. 14 is an enlarged plan view of the first substrate SUB1 opposed to the opening OPA illustrated in FIG. 11. As illustrated in the drawing, the first substrate SUB1 comprises, as peripheral lines, an outermost peripheral line WA located in the outermost periphery of the first substrate SUB1, and external peripheral lines WB located more inwardly than the outermost peripheral line WA. Such various peripheral lines include a conductive line of a fixed potential such as common potential or ground potential, a power line, an inspection line connected to an inspection pad PD, and the like. The opening OPA of the flexible substrate 3 is illustrated by a dotted line in the drawing. As shown in FIG. 13, the terminals TA1 overlap the terminals TA31 exposed from the opening OPA, and an area aligned with the terminals TA1 overlaps the connection lines W10 exposed from the opening OPA. Accordingly, in the example illustrated, in the area aligned with the terminals TA1, no peripheral line is provided in the first substrate SUB1 in a portion opposed to the connection lines W10 in planar view.

Thus, when the first connection portion 3A of the flexible substrate 3 is connected to the first substrate SUB1, as shown in FIG. 13, the connection lines W10 are opposed to the area not provided with the peripheral lines.

As described above, according to the configuration example described referring to FIGS. 11 to 14, the flexible substrate 3 includes the opening OPA extending from the one end 3D to the other end 3E in the first connection portion 3A. Therefore, when the first connection portion 3A of the flexible substrate 3 is press-fitted to the first substrate SUB1, the whole of the first connection portion 3A can evenly be pressurized, and the terminals TA1 and the terminals TA31 can be connected securely via the conductive particles 41.

Also, in the first connection portion 3A of the flexible substrate 3, not only the terminals TA31, but also the connection lines W10 are exposed from the opening OPA. However, it is possible to prevent a short-circuit from being caused by the connection lines W10 and the other conductive layers such as the peripheral lines.

Figure 15A:
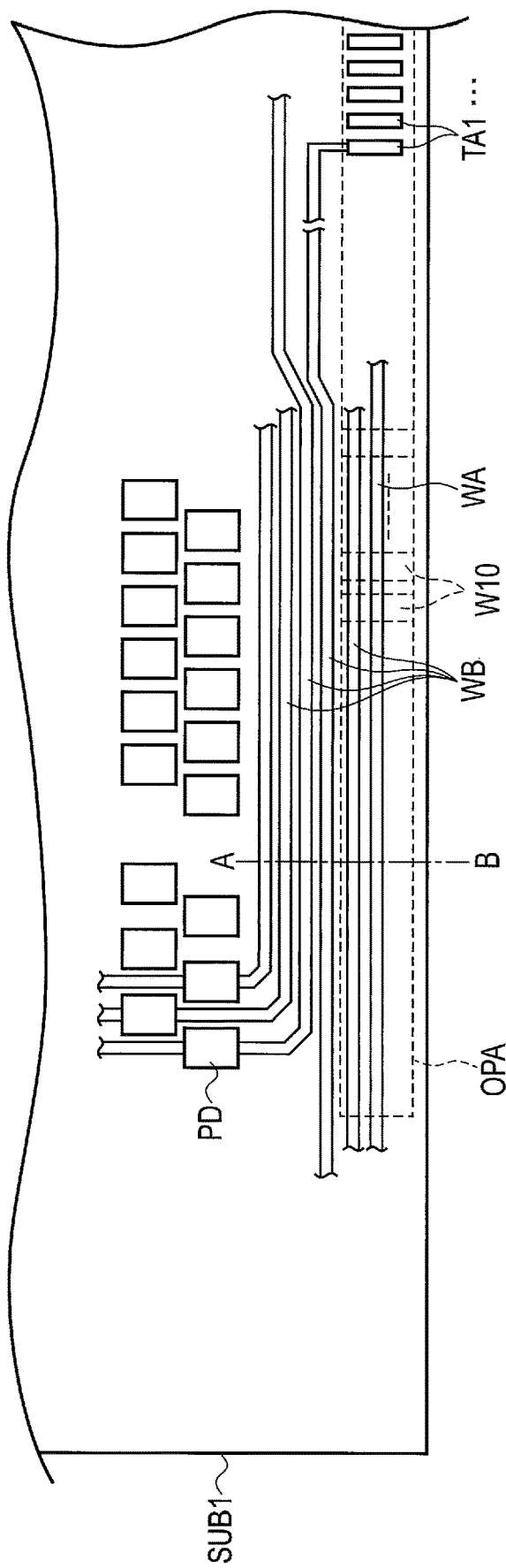
FIG. 15A is an enlarged plan view of another configuration example of the first substrate SUB1 opposed to the opening OPA illustrated in FIG. 11.

FIG. 15 is an illustration showing another configuration example of the first substrate SUB1 opposed to the opening OPA illustrated in FIG. 11. FIG. 15A is an enlarged plan view of the first substrate SUB1. As illustrated in the drawing, in the area aligned with the terminals TA1, the first substrate SUB1 comprises the outermost peripheral line WA and the external peripheral line WB, as the peripheral line, in the area opposed to the connection lines W10 exposed from the opening OPA in planar view.

Figure 15B:
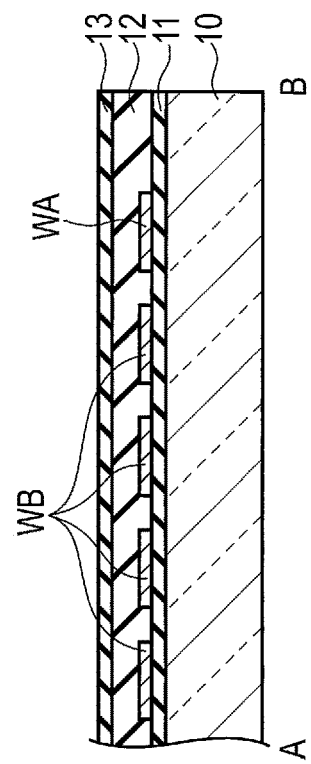
FIG. 15B is a cross-sectional view of the first substrate SUB1 taken along line A-B shown in FIG. 15A.

FIG. 15B is a cross-sectional view of the first substrate SUB1 taken along line A-B shown in FIG. 15A. In the first substrate SUB1, the outermost peripheral line WA and the external peripheral lines WB located on the first insulating substrate 10 are covered with an insulating film. In the example illustrated, the outermost peripheral line WA and the external peripheral lines WB are located on the first insulating film 11, and are covered with the second insulating film 12, and the third insulating film 13 is located on the second insulating film 12. It suffices that the outermost peripheral line WA and the external peripheral lines WB are covered with at least one insulating film.

According to such a configuration example, when the first connection portion 3A of the flexible substrate 3 is connected to the first substrate SUB1, not only the terminals TA31, but also the connection lines W10 are exposed from the opening OPA. However, since an insulating film is interposed between the interconnection lines W10 and the outermost peripheral line WA and the external peripheral line WB, the connection line W10 can be prevented from having a short-circuit with the outermost peripheral line WA and the external peripheral line WB.

Figure 16:
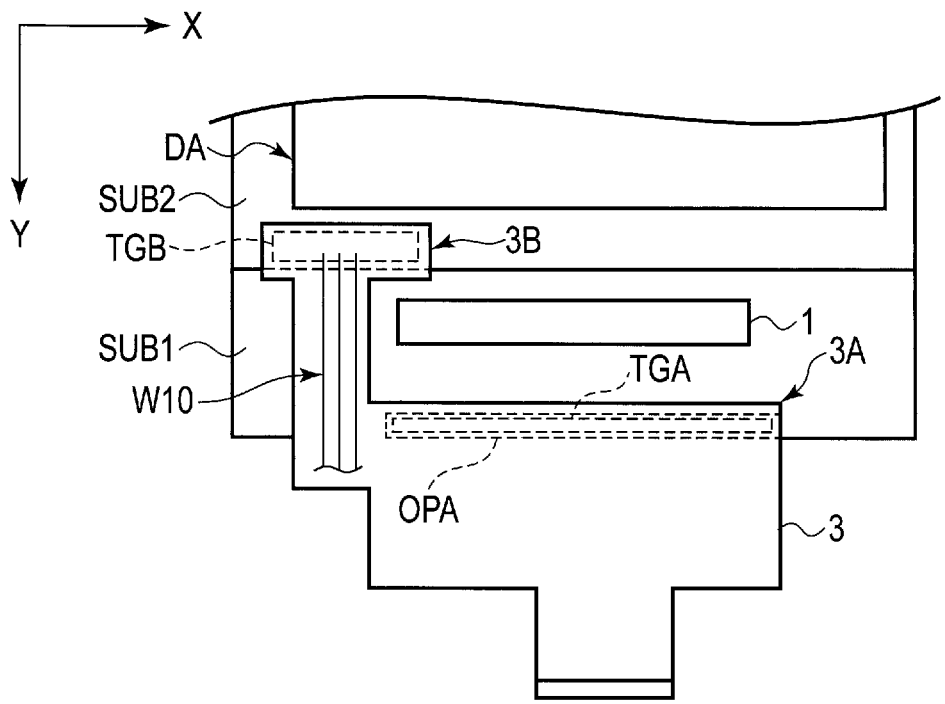
FIG. 16 is a plan view showing yet another configuration example of the flexible substrate 3 which is connected to the first substrate SUB1 and the second substrate SUB2.

FIG. 16 is a plan view showing yet another configuration example of the flexible substrate 3 which is connected to the first substrate SUB1 and the second substrate SUB2. The configuration example illustrated is different from the configuration example illustrated in FIG. 11 in that the opening OPA in the first connection portion 3A is formed only at the position which overlaps the terminal group TGA. In other words, in the direction in which the opening OPA extends, the cover layer 32 is arranged at a portion which overlaps at least the connection lines W10. The opening OPA does not intersect the connection lines W10 extending from the second connection portion 3B.

Figure 17:
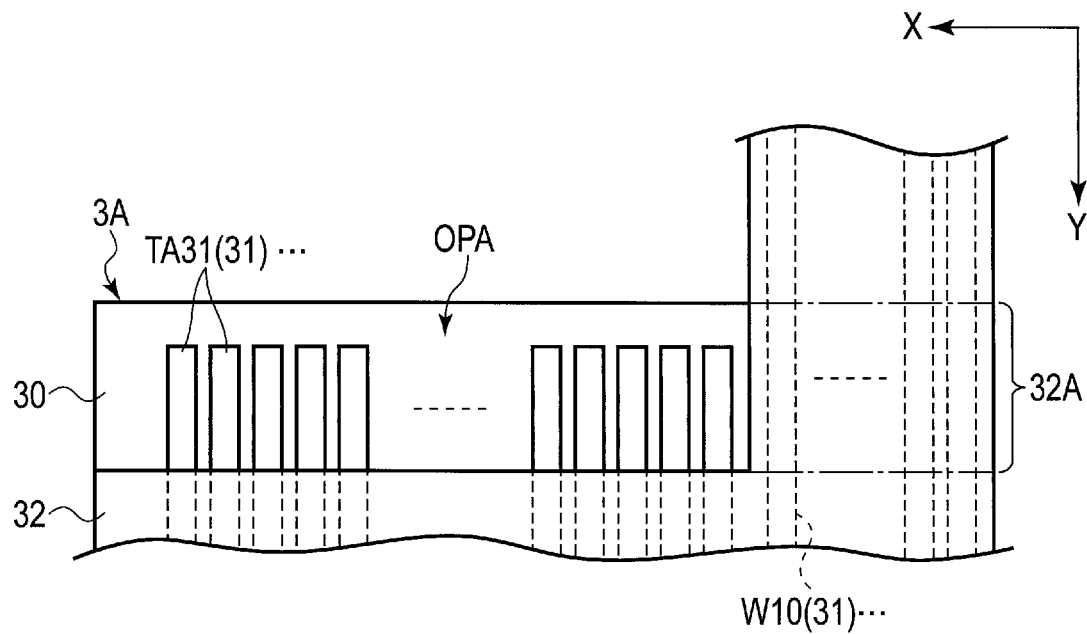
FIG. 17 is an enlarged plan view of the first connection portion 3A of the flexible substrate 3 shown in FIG. 16 as seen from the first substrate side.

FIG. 17 is an enlarged plan view of the first connection portion 3A of the flexible substrate 3 shown in FIG. 16 as seen from the first substrate side. As illustrated in the drawing, the first connection portion 3A comprises the terminals TA31 and the connection lines W10 as a part of the conductive layer 31. While the cover layer 32 covers the connection lines W10, the cover layer 32 includes the opening OPA which exposes the terminal TA31. The terminal TA31 corresponds to a first conductive layer, and the connection line W10 corresponds to a second conductive layer. The terminals TA31 and the connection lines W10 are arranged in the first direction X, and each of them extends in the second direction Y. As described above, the first direction X intersects the second direction Y. Of the cover layer 32, a portion 32A which covers the connection lines W10 and the opening OPA are arranged in the first direction X in the first connection portion 3A.

FIG. 18 is a cross-sectional view of the first connection portion 3A of the flexible substrate 3 shown in FIG. 16. As illustrated in the drawing, the first connection portion 3A is connected to the first substrate SUB1 via the conductive adhesive layer 4A. The terminals TA1 of the terminal group TGA of the first substrate SUB1 are opposed to the terminals TA31 of the first connection portion 3A, respectively, and are electrically connected to the terminals TA31 via the conductive particles 41, respectively. The cover layer 32 which covers the connection lines W10 is adhered to the first substrate SUB1 via the conductive adhesive layer 4A.

As can be seen, according to the configuration example illustrated in FIGS. 16 to 18, even if a conductive layer such as a terminal or a conductive line is provided in an area of the first substrate SUB1 opposed to the connection lines W10, since the cover layer 32 is interposed, it is possible to prevent a short-circuit from being caused by the connection lines W10 and the conductive layer of the first substrate SUB1.

FIG. 19 is a cross-sectional view of the first connection portion 3A in another configuration example of the flexible substrate 3. The configuration example illustrated is different from the configuration example shown in FIG. 18 in that the flexible substrate 3 comprises an auxiliary cover layer 33 on the opposite side of the surface of the base layer 30 on which the terminals TA31 are provided. The auxiliary cover layer 33 is provided at a position which overlaps the opening OPA of the cover layer 32. Also, thickness T33 of the auxiliary cover layer 33 is equal to thickness T32 of the cover layer 32.

According to such a configuration example, while the flexible substrate 3 includes the cover layer 32 which covers the connection lines W10, the flexible substrate 3 includes the auxiliary cover layer 33 at a position which overlaps the opening OPA of the cover layer 32. Thus, in addition to being able to prevent a short-circuit from being caused by the connection line W10 and the conductive layer of the first substrate SUB1, when the first connection portion 3A is to be press-fitted to the first substrate SUB1, an effect of a step created by the cover layer 32 can be moderated, and the whole of the first connection portion 3A can evenly be pressurized. In addition, since thickness T32 of the cover layer 32 is equal to thickness T33 of the auxiliary cover layer 33, the whole of the first connection portion 3A can evenly be pressurized even further. Thereby, the terminals TA1 and the terminals TA31 can be connected securely via the conductive particles 41.

FIG. 20 is a cross-sectional view of the first connection portion 3A in yet another configuration example of the flexible substrate 3. The configuration example illustrated is different from the configuration example illustrated in FIG. 18 in that the conductive adhesive layer 4A is located in only the opening OPA. In other words, the conductive adhesive layer 4A does not overlap the cover layer 32. In the opening OPA, the terminals TA1 of the terminal group TGA and the terminals TA31 of the first connection portion 3A are electrically connected to each other via the conductive particles 41. Note that the cover layer 32 may be in contact with the first substrate SUB1 without involving the conductive adhesive layer 4A, or may be separated from the first substrate SUB1.

According to such a configuration example, when the first connection portion 3A is to be press-fitted to the first substrate SUB1, the terminals TA1 and the terminals TA31 can be connected securely via the conductive particles 41 regardless of a step created by the cover layer 32.

Note that the sensor SS in each of the configuration examples described above is not limited to a mutual-capacitive sensor which detects an object based on a change in the electrostatic capacitance between a pair of electrodes (in the above example, the electrostatic capacitance between the sensor driving electrode Tx and the detection electrode Rx), but may be a self-capacitive sensor which detects an object based on a change in the electrostatic capacitance of the detection electrode Rx.

Figure 21A:
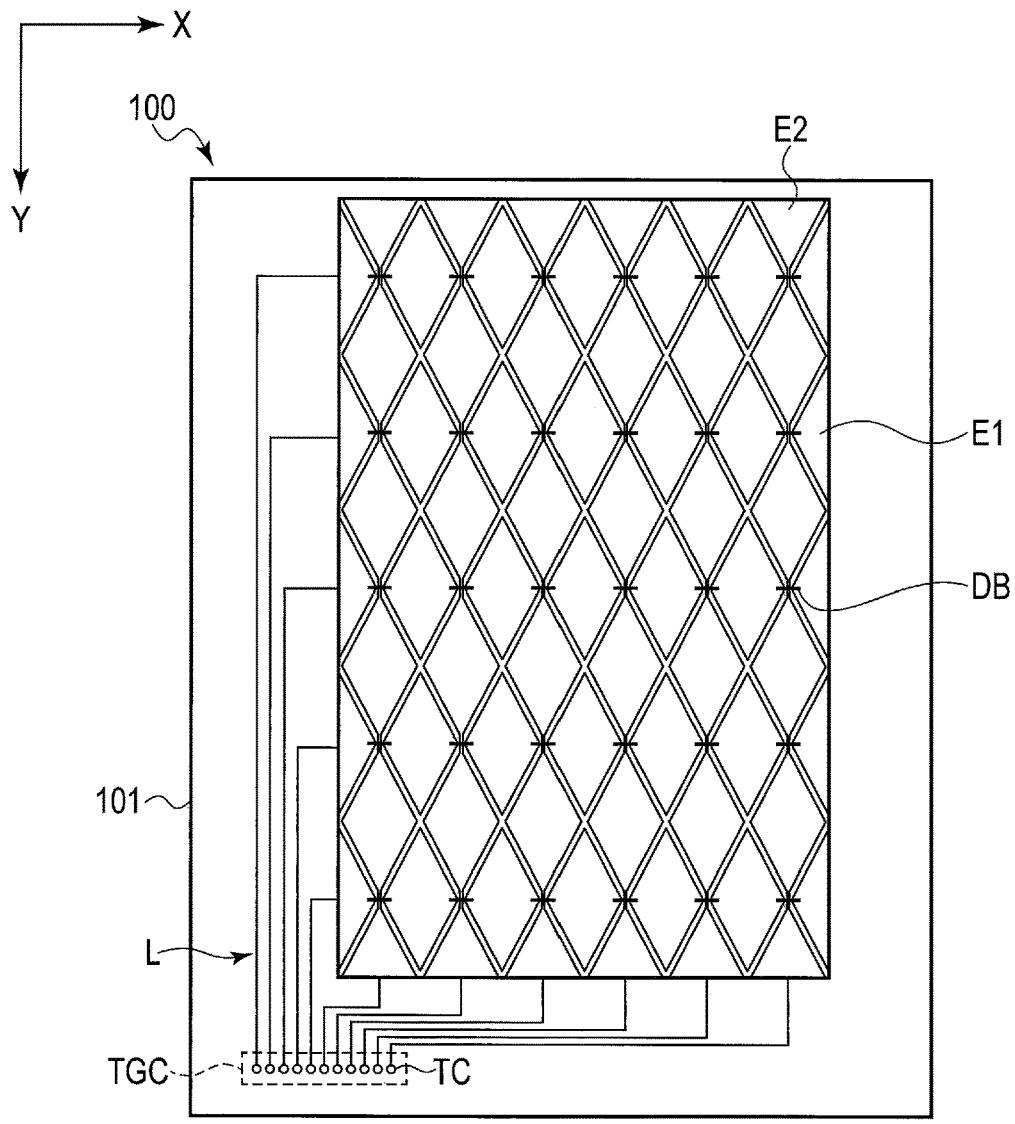
FIG. 21A is a plan view showing another sensor device 100.

FIG. 21A is a plan view showing another sensor device 100.

The sensor device 100 comprises a first touch electrode E1, a second touch electrode E2, a lead line L, and a terminal TC on a supporting substrate 101. The first touch electrodes E1 and the second touch electrodes E2 are arranged in the first direction X and the second direction Y, respectively. Each of the first touch electrodes E1 is formed in an island-like shape. The first touch electrodes E1 arranged in the first direction X are electrically connected to each other by a bridge portion DB. The first touch electrodes E1 arranged in the second direction Y are electrically independent from each other. The second touch electrodes E2 arranged in the second direction Y are electrically connected to each other in a layer under each of the bridge portions DB. The second touch electrodes E2 arranged in the first direction X are electrically independent from each other. Ends of the lead lines L on one side are electrically connected to the first touch electrodes E1 arranged in the first direction X, and the second touch electrodes E2 arranged in the second direction Y. Ends of the lead lines L on the other side are electrically connected to the terminals TC of a terminal group TGC, respectively. The terminals TC of the terminal group TGC are connected to the second connection portion 3B of the flexible substrate 3 described above.

Note that the sensor device 100 may be a mutual-capacitive device or a self-capacitive device. When the sensor device 100 is a mutual-capacitive device, for example, the first touch electrode E1 corresponds to the detection electrode Rx, and the second touch electrode E2 corresponds to the sensor driving electrode Tx. Further, when the sensor device 100 is a self-capacitive device, both of the first touch electrode E1 and the second touch electrode E2 correspond to the detection electrode Rx.

Figure 21B:
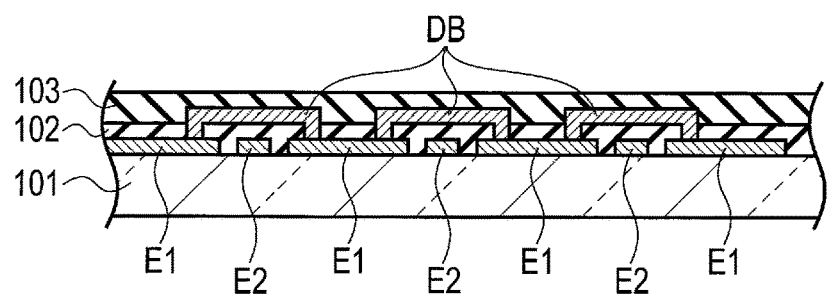
FIG. 21B is a cross-sectional view of the sensor device 100 shown in FIG. 21A.

FIG. 21B is a cross-sectional view of the sensor device 100 shown in FIG. 21A.

The first touch electrode E1 and the second touch electrode E2 are located on the same surface of the supporting substrate 101, and are covered by an insulating film 102. The bridge portion DB is located on the insulating film 102, and contacts the first touch electrodes E1 adjacent to each other with the second touch electrode E2 interposed therebetween via a contact hole which penetrates the insulating film 102. The bridge portion DB is covered by an insulating film 103.

FIG. 22 is a plan view showing yet another sensor device 100. The sensor device 100 illustrated is different from the sensor device 100 shown in FIG. 21A in that the sensor device can be constituted of a single layer without requiring a bridge portion. The sensor device 100 comprises electrode groups EGa, EGb, EGc, EGd, . . . , arranged in the first direction X. Each electrode group EG is structured similarly, and includes a first touch electrode E1, a second touch electrode E2 and lead lines L. Here, paying attention to the electrode group EGa, the structure of this electrode group will be described.

The first touch electrode E1 includes sensor elements Ea1, Ea2, Ea3, . . . , arranged in the second direction Y to be spaced apart from each other. In the example illustrated, each of the sensor elements Ea1, Ea2, Ea3, . . . , is shaped in a letter F and includes two comb teeth extending in the first direction X. However, the shape of each of the sensor elements is not limited to the illustrated example. The second touch electrode E2 is disposed to be spaced apart from the sensor elements Ea1, Ea2, Ea3, . . . , etc. In the example illustrated, the second touch electrode E2 is shaped like a comb, and includes comb teeth extending toward the first touch electrode E1 in the first direction X. The comb teeth of such second touch electrode E2 are disposed alternately with the comb teeth of the sensor elements Ea1, Ea2, Ea3, . . . , etc. The intervals between the first touch electrode E1 and the second touch electrode E2 are substantially constant.

Lead lines La1, La2, La3, . . . , are disposed on a side opposite to the second touch electrode E2 so that the first touch electrode E1 is sandwiched between the lead lines and the second electrode, and are electrically connected to the sensor elements Ea1, Ea2, Ea3, . . . , respectively. More specifically, the lead line La1 is joined to an end portion of the sensor element Ea1, and is arranged to be spaced apart from the sensor element Ea2 and the lead line La2 at substantially regular intervals. The lead line La2 is joined to an end portion of the sensor element Ea2, and is located between the sensor element Ea3 and the lead line La1 and between the lead line La1 and the lead line La3.

In the example illustrated, the sensor device 100 further comprises a third electrode E3 disposed around each of the electrode groups EGa, EGb, EGc, EGd . . . , and a fourth electrode E4 disposed between the third electrode E3 and the sensor elements, and at least a part of the lead lines, of each of the electrode groups. The third electrode E3 functions as a shielding electrode which electrically shields each of the adjacent electrode groups. The fourth electrode E4 functions as a dummy electrode which suppresses coupling of the third electrode E3 with the sensor elements of the first touch electrode E1 and the lead lines L.

Note that the sensor device 100 may be a mutual-capacitive device or a self-capacitive device. When the sensor device 100 is a mutual-capacitive device, for example, the first touch electrode E1 corresponds to the detection electrode Rx, and the second touch electrode E2 corresponds to the sensor driving electrode Tx. Further, when the sensor device 100 is a self-capacitive device, both of the first touch electrode E1 and the second touch electrode E2 correspond to the detection electrode Rx.

As described above, the sensor device applicable to the present embodiment is not limited to one in which the electrodes extend in a specific direction, and are arranged in a specific direction, but may be one in which the sensor elements are arrayed in a matrix as shown in FIG. 22.

In the present specification, a first electrode corresponds to any one of the electrodes provided on the first substrate SUB1. For example, the first electrode is any one of the pixel electrode PE, the common electrode CE shown in FIG. 3, and the sensor driving electrode Tx shown in FIGS. 4D and 4F. Also, a second electrode corresponds to any one of the electrodes provided on the second substrate SUB2. For example, the second electrode is any one of the detection electrode Rx shown in FIG. 3, the first touch electrode E1 and the second touch electrode E2 shown in FIGS. 21A and 22.

An application example of the display device DSP comprising the sensor device 100 described with reference to FIG. 21A or FIG. 22 will now be specifically explained.

Figure 23:
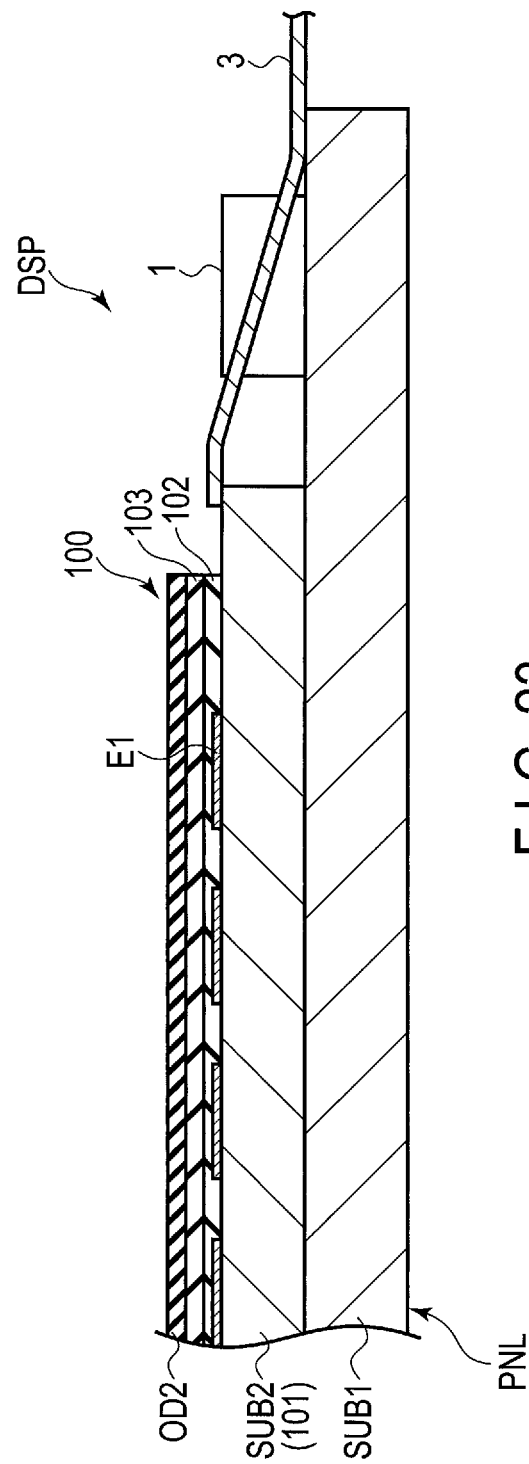
FIG. 23 is a cross-sectional view showing an application example of the display device DSP comprising the sensor device 100.

FIG. 23 is a cross-sectional view showing the application example of the display device DSP comprising the sensor device 100. In the application example illustrated, the supporting substrate 101 of the above-described sensor device 100 corresponds to the second substrate SUB2 of the display panel PNL. That is, the first touch electrode E1, the second touch electrode (not illustrated), the insulating films 102 and 103, etc., are located on the upper side of the second substrate SUB2. The second optical element OD2 is located on the insulating film 103. In this application example, the flexible substrate 3 is connected to each of the first substrate SUB1 and the second substrate SUB2. Though not described in detail, the flexible substrate 3 is electrically connected to the terminals TC of the terminal group TGC as shown in FIG. 21, in the second substrate SUB2.

FIG. 24 is a cross-sectional view showing another application example of the display device DSP comprising the sensor device 100. In the application example illustrated, the sensor device 100 is provided separately from the display panel PNL. The supporting substrate 101 is located over the display panel PNL. The first touch electrode E1, the second touch electrode (not illustrated), the insulating films 102 and 103, etc., are located on the upper side of the supporting substrate 101, that is, the side opposite to the side which faces the display panel PNL. In this application example, the flexible substrate 3 is connected to each of the first substrate SUB1 and the supporting substrate 101.

Note that in the application example illustrated, the first touch electrode E1, etc., may be opposed to the side which faces the display panel PNL of the supporting substrate 101.

FIG. 25A is a cross-sectional view showing yet another application example of the display device DSP comprising the sensor device 100. In the application example illustrated, the sensor device 100 is provided separately from the display panel PNL, and is located over the display panel PNL. The first touch electrode E1, the insulating film 102, etc., are located on the upper side of the supporting substrate 101. Meanwhile, the second touch electrode E2 is located on the upper side of the second substrate SUB2 of the display panel PNL. In this application example, the flexible substrate 3 is connected to each of the first substrate SUB1, the second substrate SUB2, and the supporting substrate 101.

Note that in the application example illustrated, the first touch electrode E1, etc., may be disposed on the side which faces the display panel PNL of the supporting substrate 101.

Figure 25B:
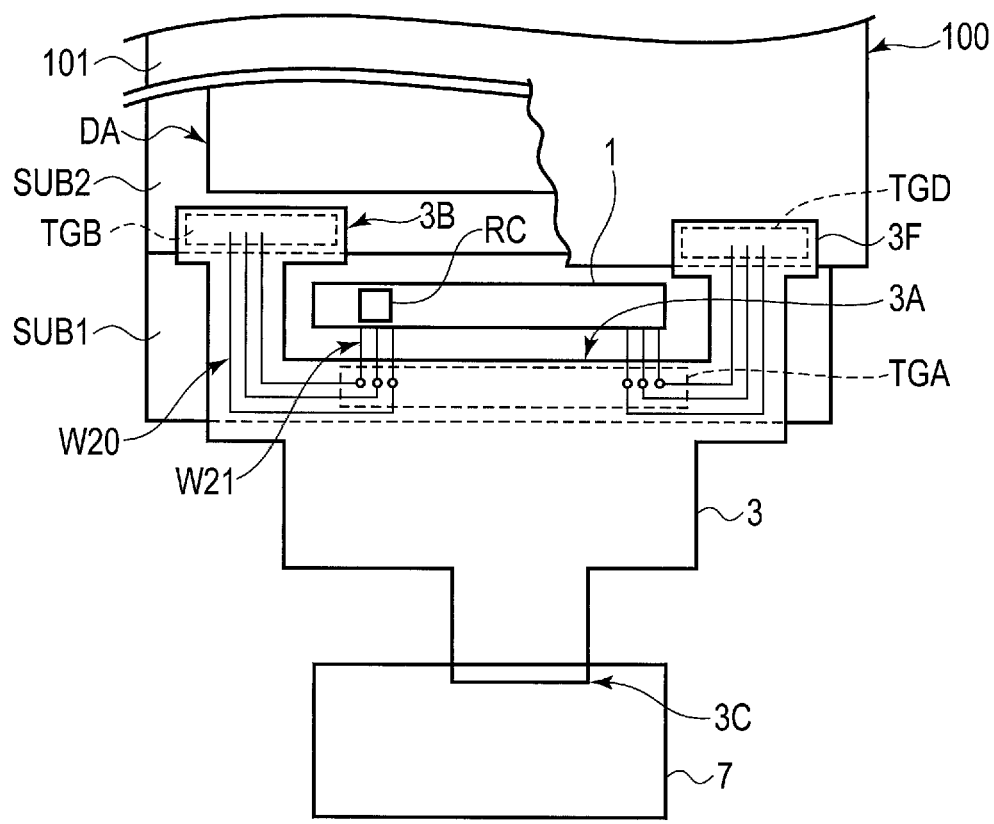
FIG. 25B is a plan view of the display device DSP shown in FIG. 25A.

FIG. 25B is a plan view of the display device DSP shown in FIG. 25A. Note that in the drawing, in order to clarify the position where the flexible substrate 3 is connected with the second substrate SUB2, and also with the sensor device 100, the sensor device 100 opposed to the second connection portion 3B is partly cut out. The flexible substrate 3 comprises a fourth connection portion 3F, in addition to the first connection portion 3A, the second connection portion 3B, and the third connection portion 3C, as described above. In the example illustrated, the fourth connection portion 3F is located on a side opposite to the second connection portion 3B with the driving IC chip 1 interposed therebetween in planar view. The second connection portion 3B is arranged at a position which overlaps the terminal group TGB, and is connected to the second substrate SUB2. Each of the terminals of the terminal group TGB is electrically connected to the second touch electrode E2 as shown in FIG. 25A. The fourth connection portion 3F is arranged at a position which overlaps a terminal group TGD, and is connected to the supporting substrate 101. Terminals of the terminal group TGD are electrically connected to the first touch electrodes E1 shown in FIG. 25A, respectively. The flexible substrate 3 is connected to the terminal group TGA of the first substrate SUB1, and is connected to the detection circuit RC incorporated in the driving IC chip 1 via the connection lines W21. Thereby, the first touch electrode E1 and the second touch electrode E2 are electrically connected to the detection circuit RC. Although the detection circuit RC is incorporated in the driving IC chip 1 in the example illustrated, when the detection circuit RC is incorporated in the other IC chip on the flexible substrate 3 such as the IC chip 5 as shown in FIG. 8, etc., the first touch electrode E1 and the second touch electrode E2 are electrically connected to the detection circuit RC via the conductive lines of the flexible substrate 3.

In any of the application examples, a single flexible substrate 3 is connected to each of the substrates, and forms a transmission path for transmitting a signal between the electrodes or conductive lines of the respective substrates. Accordingly, an advantage similar to that of each of the above-described configuration examples can be obtained. Further, as regards the structure of connection between the flexible substrate 3 and each of the substrates, any of the configuration examples described above is applicable.

FIG. 26 is a plan view showing yet another configuration example of the flexible substrate 3 which is connected to the first substrate SUB1 and the second substrate SUB2. The configuration example illustrated is different from the above-described configuration examples in that the driving IC chip 1 is mounted on the flexible substrate 3. In the example illustrated, although the detection circuit RC is incorporated in the driving IC chip 1, it may be incorporated in another IC chip on the flexible substrate 3. In the flexible substrate 3, the first connection portion 3A is arranged at a position which overlaps the terminal group TGA, and is connected to the first substrate SUB1. Though not described in detail, each of the terminals of the terminal group TGA is electrically connected to the scanning line, the signal line, the sensor driving electrode (or the first touch electrode), etc. The second connection portion 3B is arranged at a position which overlaps the terminal group TGB, and is connected to the second substrate SUB2. Each of the terminals of the terminal group TGB is electrically connected to the detection electrode (or the second touch electrode), or the like, though not described in detail. Also in this configuration example, a single flexible substrate 3 is connected to each of the substrates, and forms a transmission path for transmitting a signal between the electrodes or conductive lines of the respective substrates. Accordingly, an advantage similar to that of each of the above-described configuration examples can be obtained.

As described above, according to the present embodiment, a sensor-equipped display device whose structure can be simplified can be provided.

In the above example, the flexible substrate 3 is connected to each of the first substrate SUB1 and the second substrate SUB2, and includes a transmission path for transmitting a signal between an electrode which is mainly used for display and a detection electrode which constitutes the sensor SS. However, the structure is not limited to this. It suffices that the flexible substrate 3 of the present embodiment is connected to each of different substrates, and is configured to transmit a signal between the electrodes or conductive lines provided in the respective substrates.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A sensor device comprising:
a first substrate including a first terminal;
a second substrate including a second terminal configured to output a sensor signal; and
a flexible substrate including a first region and a second region protruding from the first region, wherein
the first region includes a first connection portion connected to the first substrate,
the second region includes a second connection portion connected to the second substrate,
a first connection line located in the flexible substrate is electrically connected to the first terminal and extends in the first region,
a second connection line located in the flexible substrate is electrically connected to the second terminal and includes a first portion and a second portion,
the first connection line is different from the second connection line, and is not directly connected to the second connection line,
the first portion is located in the second region,
the second portion is located in the first region and is electrically connected to the first portion,
a part of the first portion extends in the second region in a first direction,
the flexible substrate includes a cover layer covering the first connection line,
the cover layer includes a first opening exposing a part of the first connection line,
the first opening overlaps the first terminal, and
the second connection line is aligned with the first opening in a second direction intersecting the first direction.

2. The sensor device of claim 1, wherein the first portion is connected to the second terminal via conductive particles.

3. The sensor device of claim 1, wherein the second connection line is aligned with the first terminal in an area overlapping the first substrate.

4. The sensor device of claim 1, further comprising a driving IC chip mounted on the first substrate, wherein the second connection line is aligned with the driving IC chip in an area overlapping the first substrate.

5. The sensor device of claim 4, wherein the second region does not overlap the driving IC chip in a planar view.

6. The sensor device of claim 1, wherein the second connection line is aligned with the first connection line in the first region.

7. The sensor device of claim 1, wherein the cover layer covers the second connection line and includes a second opening exposing the second connection line in the second connection portion.

8. The sensor device of claim 7, wherein the second connection line is electrically connected to the second terminal in an area overlapping the second opening.

9. A sensor-equipped display device comprising:
a first substrate including a first electrode and a first terminal connected to the first electrode;
a second substrate including a second electrode and a second terminal connected to the second electrode, the second terminal configured to output a sensor signal; and
a flexible substrate including a first region and a second region protruding from the first region, wherein
the first region includes a first connection portion connected to the first substrate,
the second region includes a second connection portion connected to the second substrate,
a first connection line located in the flexible substrate is electrically connected to the first terminal and extends in the first region,
a second connection line located in the flexible substrate is electrically connected to the second terminal and includes a first portion and a second portion,
the first connection line is different from the second connection line, and is not directly connected to the second connection line,
the first portion is located in the second region,
the second portion is located in the first region and is electrically connected to the first portion,
a part of the first portion extends in the second region in a first direction,
the flexible substrate includes a cover layer covering the first connection line,
the cover layer includes a first opening exposing a part of the first connection line,
the first opening overlaps the first terminal, and
the second connection line is aligned with the first opening in a second direction intersecting the first direction.

10. The sensor-equipped display device of claim 9, further comprising a display panel including the first substrate, wherein
a pixel signal is input to the first electrode via the first terminal.

11. The sensor-equipped display device of claim 9, wherein the first portion is connected to the second terminal via conductive particles.

12. The sensor-equipped display device of claim 9, wherein the second connection line is aligned with the first terminal in an area overlapping the first substrate.

13. The sensor-equipped display device of claim 9, further comprising a driving IC chip mounted on the first substrate, wherein the second connection line is aligned with the driving IC chip in an area overlapping the first substrate.

14. The sensor-equipped display device of claim 13, wherein the second region does not overlap the driving IC chip in a planar view.

15. The sensor-equipped display device of claim 9, wherein the second connection line is aligned with the first connection line in the first region.

16. The sensor-equipped display device of claim 9, wherein the cover layer covers the second connection line and includes a second opening exposing the second connection line in the second connection portion.

17. The sensor device of claim 16, wherein the second connection line is electrically connected to the second terminal in an area overlapping the second opening.

* * * * *